(12) United States Patent
Buchowski et al.

(10) Patent No.: US 8,589,128 B2
(45) Date of Patent: Nov. 19, 2013

(54) METHODS AND SYSTEMS FOR CREATION OF A DYNAMICALLY CONFIGURABLE PRODUCT DESIGN

(75) Inventors: John Christopher Buchowski, San Jose, CA (US); Rudy Hubert Slegers, Heerlen (NL)

(73) Assignee: Parametric Technology Corporation, Needham, MA (US)

(*) Notice: Subject to any disclaimer, the term of this patent is extended or adjusted under 35 U.S.C. 154(b) by 364 days.

(21) Appl. No.: 12/913,992

(22) Filed: Oct. 28, 2010

(65) Prior Publication Data

US 2012/0109350 A1 May 3, 2012

(51) Int. Cl.
*G06F 17/50* (2006.01)

(52) U.S. Cl.
USPC ......... 703/2; 703/6; 700/97; 700/98; 700/182

(58) Field of Classification Search
CPC . G06F 17/50; G06F 2217/08; G06F 17/5009; G06T 19/00
USPC .............................. 703/2, 6; 700/97, 98, 182
See application file for complete search history.

(56) References Cited

U.S. PATENT DOCUMENTS

| | | | |
|---|---|---|---|
| 7,006,956 B1 * | 2/2006 | Gerlovin et al. | 703/6 |
| 7,751,917 B2 * | 7/2010 | Rees et al. | 700/97 |
| 2005/0071135 A1 | 3/2005 | Vredenburgh et al. | |
| 2005/0203718 A1 | 9/2005 | Carek et al. | |
| 2007/0073429 A1 * | 3/2007 | Rees et al. | 700/97 |
| 2007/0198230 A1 | 8/2007 | Wang et al. | |
| 2008/0040080 A1 | 2/2008 | Bae et al. | |
| 2008/0201113 A1 | 8/2008 | Stenacker | |
| 2008/0247636 A1 | 10/2008 | Davis et al. | |
| 2008/0309678 A1 | 12/2008 | Reghetti et al. | |
| 2009/0259442 A1 | 10/2009 | Gandikota et al. | |

OTHER PUBLICATIONS

International Search Report for PCT/US2011/058406, mailed on May 14, 2012 (4 pages).
Written Opinion for PCT/US2011/058406, mailed on May 14, 2012 (22 pages).

\* cited by examiner

*Primary Examiner* — Thai Phan
(74) *Attorney, Agent, or Firm* — Choate, Hall & Stewart LLP; William R. Haulbrook; Daniel S. Matthews

(57) ABSTRACT

The present disclosure features methods and systems for creation of a dynamically configurable product design, sometimes referred to as business driven assemblies. Such product designs may be referred to as driven by a bill-of-materials (BOM) or selection of options by a customer, sales representative, or vendor, and may be performed responsive to a product lifecycle management (PLM) plan. The system allows a customer to define specifications of a product, and then dynamically generates a CAD model responsive to the defined specifications or selected options.

21 Claims, 18 Drawing Sheets

METHODS AND SYSTEMS FOR CREATION OF A DYNAMICALLY CONFIGURABLE PRODUCT DESIGN

FIELD OF THE INVENTION

The present disclosure relates to methods and systems for computer-aided design. In particular, the present disclosure relates to methods and systems for creation of a dynamically configurable product design.

BACKGROUND OF THE INVENTION

In many industries, from industrial product design to 3D animation, computer-aided design (CAD) applications, computer-aided engineering (CAE) applications, computer-aided manufacturing (CAM) applications, or others are used for creating, manipulating, displaying, or analyzing two- and three-dimensional models of objects. These applications, referred to generally as CAD applications, allow a user to input and view a design for a particular structure in the form of an object. The user can often rotate the view of the object to any angle, and also zoom in or zoom out for different views and perspectives. Additional visual features such as highlighting, shading, cross-hatching, coloring, texturing, and others enable the user to design an object with the aid of a computing device. In some versions of CAD applications, known as parametric or history-based CAD, the application can also keep track of and monitor design changes to the object in addition to design dependencies. Accordingly, when the user adds or changes an element within the object, other values that depend on that change may be automatically updated in accordance with engineering concepts and rules of design. For example, a length of a first object may be defined by a formula that includes, as a variable, a length of a second object. Accordingly, modifying the length of the second object may cause the CAD application to recalculate the length of the first object and regenerate the model.

While in many uses, objects may be simple assemblies of a few basic geometric shapes, in others, objects may include many thousands of complex parts. For example, a detailed CAD model of an automobile may include thousands of unique features of diverse types including tread design on tires, taillight lens design, electrical subsystem routing, instrument panel layout, spark plug gap spacing, seatbelt latch design, and many others. This complexity may result in slow operation of these applications. Furthermore, due to the complexity, these programs typically have very steep learning curves.

BRIEF SUMMARY OF THE INVENTION

The present disclosure features methods and systems for creation of a dynamically configurable product design, sometimes referred to as business driven assemblies. Such product designs may be referred to as driven by a bill-of-materials (BOM) or selection of options by a customer, sales representative, or vendor, and may be performed responsive to a product lifecycle management (PLM) plan. The system allows a customer to define specifications of a product, and then dynamically generates a CAD model responsive to the defined specifications or selected options.

In one aspect, the present invention is directed to a method for creation of a dynamically-configurable product design. The method includes creating, by a user of a computer-aided design (CAD) application executing on a processor of a computing device, a modular structure of a plurality of modules of a dynamically-configurable product design, the plurality of modules comprising at least one variable module. The method also includes selecting, by the user from a plurality of variants of the at least one variable module, a variant to use in the dynamically-configurable product design. The method further includes placing, by the CAD application, the selected variant in a geometric model of the dynamically-configurable product design. The method also includes modifying, by the CAD application, positioning or geometry of a module adjacent to the placed selected variant in the geometric model responsive to one or more constraints of the placed selected variant.

In one embodiment, the method includes the modular structure comprising a tree of relationships of modules of a product design. In another embodiment, the method includes each module of the product design including a locator interface or a shaper interface. In yet another embodiment, the method includes each variant of the plurality of variants of the at least one variable module including a corresponding locator interface or shaper interface. In still another embodiment, the method includes the plurality of variants of the at least one variable module including a generic variant.

In some embodiments, the method includes selecting, by the user, a variant from a predetermined list of variants of the variable module presented by a product configuration tool. In other embodiments, the method includes replacing a previously-used variant of the at least one variable module in the geometric model with the selected variant. In one embodiment, the method includes modifying positioning or geometry of the adjacent module to align an interface of the adjacent module to a corresponding interface of the placed selected variant. In another embodiment, the method includes the one or more constraints of the placed selected variant comprising rules for aligning a locator or shaper interface of an adjacent module to a corresponding locator or shaper interface of the placed selected variant. In some embodiments, the method includes the dynamically-configurable product design comprising an historic recipe of feature-based geometry of a CAD model.

In another aspect, the present invention features a system for creation of a dynamically-configurable product design. The system includes a computing device comprising a processor, the processor configured to execute a computer-aided design (CAD) application for creating, by a user of the CAD application, a modular structure of a plurality of modules of a dynamically-configurable product design, the plurality of modules comprising at least one variable module; a selection interface for selecting, by the user from a plurality of variants of the at least one variable module, a variant to use in the dynamically-configurable product design; and a geometry engine for placing the selected variant in a geometric model of the dynamically-configurable product design, and modifying positioning or geometry of a module adjacent to the placed selected variant in the geometric model responsive to one or more constraints of the placed selected variant.

In some embodiments of the system, the modular structure comprises a tree of relationships of modules of a product design. In other embodiments of the system, each module of the product design includes a locator interface or a shaper interface. In still other embodiments of the system, each variant of the plurality of variants of the at least one variable module includes a corresponding locator interface or shaper interface. In yet still other embodiments of the system, the plurality of variants of the at least one variable module includes a generic variant.

In one embodiment of the system, the selection interface is configured for selecting, by the user, a variant from a predetermined list of variants of the variable module presented by a product configuration tool. In another embodiment of the system, the geometry engine is configured for replacing a previously-used variant of the at least one variable module in the geometric model with the selected variant. In still another embodiment of the system, the geometry engine is configured for modifying positioning or geometry of the adjacent module to align an interface of the adjacent module to a corresponding interface of the placed selected variant. In yet still another embodiment of the system, the one or more constraints of the placed selected variant comprise rules for aligning a locator or shaper interface of an adjacent module to a corresponding locator or shaper interface of the placed selected variant. In some embodiments of the system, the dynamically-configurable product design comprises an historic recipe of feature-based geometry of a CAD model.

The details of various embodiments of the invention are set forth in the accompanying drawings and the description below.

BRIEF DESCRIPTION OF THE FIGURES

The foregoing and other objects, aspects, features, and advantages of the disclosure will become more apparent and better understood by referring to the following description taken in conjunction with the accompanying drawings, in which.

Figure 1A:
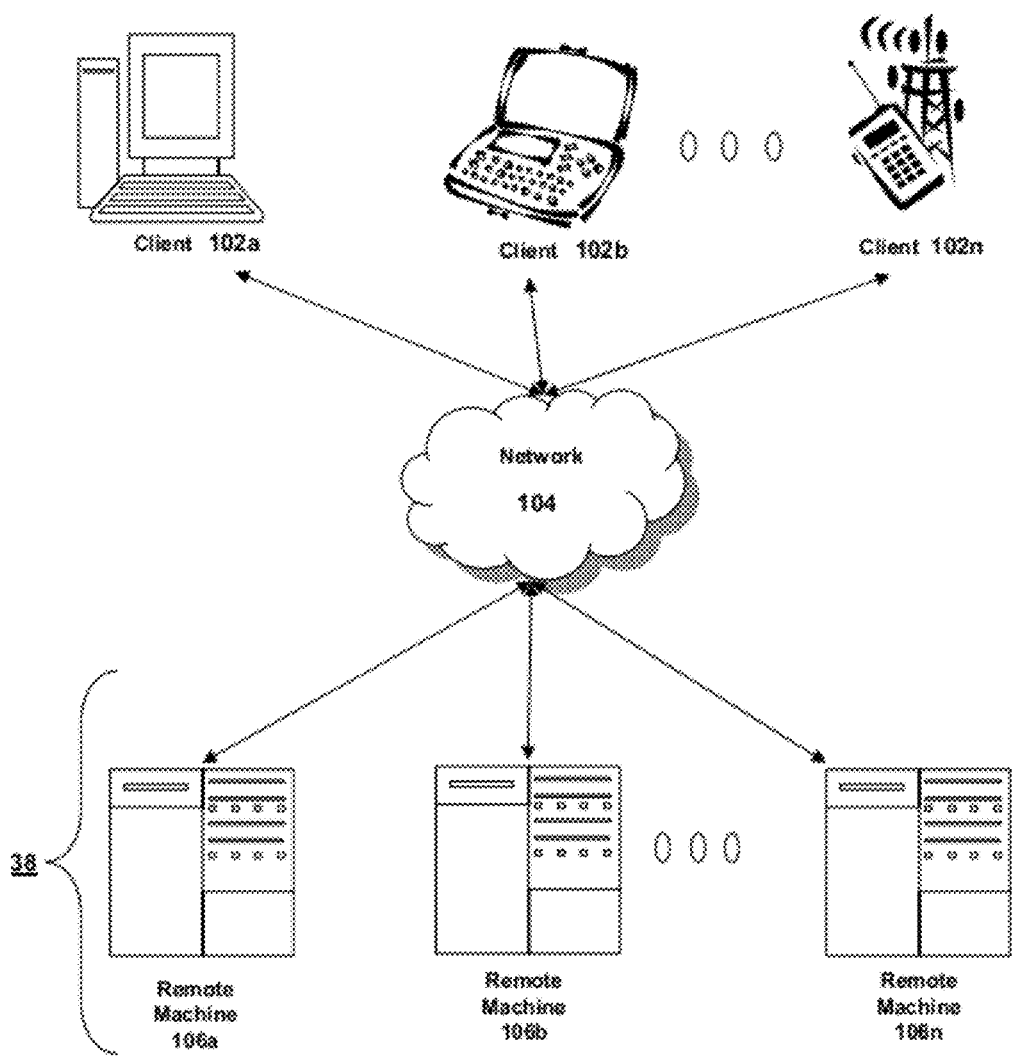
FIG. 1A is a block diagram depicting an embodiment of a network environment comprising local machines in communication with remote machines.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

For purposes of reading the description of the various embodiments below, the following descriptions of the sections of the specification and their respective contents may be helpful:

Section A describes a network environment and computing environment which may be useful for practicing embodiments described herein;

Section B describes embodiments of systems and methods for using a direct computer-aided design modeling user interface for creating and modifying a parametric computer-aided design model;

Section C describes embodiments of systems and methods for creating business driven assemblies; and Section D describes embodiments of systems and methods for dynamically loading portions of a computer-aided design model on demand.

A. Network and Computing Environment

Before discussing details of the embodiments of methods and systems of computer-aided design, it may be useful to briefly describe a network environment and computing environment which may be useful for practicing the embodiments herein. Referring now to FIG. 1A, an embodiment of a network environment is depicted. In brief overview, the network environment comprises one or more local machines 102a-102n (also generally referred to as local machine(s) 102, client(s) 102, client node(s) 102, client machine(s) 102, client computer(s) 102, client device(s) 102, endpoint(s) 102, or endpoint node(s) 102) in communication with one or more remote machines 106a-106n (also generally referred to as server(s) 106 or remote machine(s) 106) via one or more networks 104. In some embodiments, a local machine 102 has the capacity to function as both a client node seeking access to resources provided by a server and as a server providing access to hosted resources for other clients 102a-102n.

Although FIG. 1A shows a network 104 between the local machines 102 and the remote machines 106, the local machines 102 and the remote machines 106 may be on the same network 104. The network 104 can be a local-area network (LAN), such as a company Intranet, a metropolitan area network (MAN), or a wide area network (WAN), such as the Internet or the World Wide Web. In some embodiments, there are multiple networks 104 between the local machines 102 and the remote machines 106. In one of these embodiments, a network 104' (not shown) may be a private network and a network 104 may be a public network. In another of these embodiments, a network 104 may be a private network and a network 104' a public network. In still another embodiment, networks 104 and 104' may both be private networks. In yet another embodiment, networks 104 and 104' may both be public networks.

The network 104 may be any type and/or form of network and may include any of the following: a point to point network, a broadcast network, a wide area network, a local area network, a telecommunications network, a data communication network, a computer network, an ATM (Asynchronous Transfer Mode) network, a SONET (Synchronous Optical Network) network, a SDH (Synchronous Digital Hierarchy) network, a wireless network and a wireline network. In some embodiments, the network 104 may comprise a wireless link, such as an infrared channel or satellite band. The topology of the network 104 may be a bus, star, or ring network topology. The network 104 may be of any such network topology as known to those ordinarily skilled in the art capable of supporting the operations described herein. The network may comprise mobile telephone networks utilizing any protocol or protocols used to communicate among mobile devices, including AMPS, TDMA, CDMA, GSM, GPRS or UMTS. In some embodiments, different types of data may be transmitted via different protocols. In other embodiments, the same types of data may be transmitted via different protocols.

In some embodiments, the system may include multiple, logically-grouped remote machines 106. In one of these embodiments, the logical group of remote machines may be referred to as a server farm 38. In another of these embodiments, the remote machines 106 may be geographically dispersed. In other embodiments, a server farm 38 may be administered as a single entity. In still other embodiments, the server farm 38 comprises a plurality of server farms 38. The remote machines 106 within each server farm 38 can be heterogeneous—one or more of the remote machines 106 can operate according to one type of operating system platform (e.g., WINDOWS NT, WINDOWS 2003, WINDOWS 2008, WINDOWS 7 and WINDOWS Server 2008R2, all of which are manufactured by Microsoft Corp. of Redmond, Wash.), while one or more of the other remote machines 106 can operate on according to another type of operating system platform (e.g., Unix or Linux).

The remote machines 106 of each server farm 38 do not need to be physically proximate to another remote machine 106 in the same server farm 38. Thus, the group of remote machines 106 logically grouped as a server farm 38 may be interconnected using a wide-area network (WAN) connection or a metropolitan-area network (MAN) connection. For example, a server farm 38 may include remote machines 106 physically located in different continents or different regions of a continent, country, state, city, campus, or room. Data transmission speeds between remote machines 106 in the server farm 38 can be increased if the remote machines 106 are connected using a local-area network (LAN) connection or some form of direct connection.

A remote machine 106 may be a file server, application server, web server, proxy server, appliance, network appliance, gateway, application gateway, gateway server, virtualization server, deployment server, SSL VPN server, or firewall. In some embodiments, a remote machine 106 provides a remote authentication dial-in user service, and is referred to as a RADIUS server. In other embodiments, a remote machine 106 may have the capacity to function as either an application server or as a master application server. In still other embodiments, a remote machine 106 is a blade server. In yet other embodiments, a remote machine 106 executes a virtual machine providing, to a user or client computer 102, access to a computing environment.

In one embodiment, a remote machine 106 may include an Active Directory. The remote machine 106 may be an application acceleration appliance. For embodiments in which the remote machine 106 is an application acceleration appliance, the remote machine 106 may provide functionality including firewall functionality, application firewall functionality, or load balancing functionality. In some embodiments, the remote machine 106 comprises an appliance such as one of the line of appliances manufactured by the Citrix Application Networking Group, of San Jose, Calif., or Silver Peak Systems, Inc., of Mountain View, Calif., or of Riverbed Technology, Inc., of San Francisco, Calif., or of F5 Networks, Inc., of Seattle, Wash., or of Juniper Networks, Inc., of Sunnyvale, Calif.

In some embodiments, a remote machine 106 executes an application on behalf of a user of a local machine 102. In other embodiments, a remote machine 106 executes a virtual machine, which provides an execution session within which applications execute on behalf of a user of a local machine 102. In one of these embodiments, the execution session is a hosted desktop session. In another of these embodiments, the execution session provides access to a computing environment, which may comprise one or more of: an application, a plurality of applications, a desktop application, and a desktop session in which one or more applications may execute.

In some embodiments, a local machine 102 communicates with a remote machine 106. In one embodiment, the local machine 102 communicates directly with one of the remote machines 106 in a server farm 38. In another embodiment, the local machine 102 executes a program neighborhood application to communicate with a remote machine 106 in a server farm 38. In still another embodiment, the remote machine 106 provides the functionality of a master node. In some embodiments, the local machine 102 communicates with the remote machine 106 in the server farm 38 through a network 104. Over the network 104, the local machine 102 can, for example, request execution of various applications hosted by the remote machines 106a-106n in the server farm 38 and receive output of the results of the application execution for display. In some embodiments, only a master node provides the functionality required to identify and provide address information associated with a remote machine 106b hosting a requested application.

In one embodiment, the remote machine 106 provides the functionality of a web server. In another embodiment, the remote machine 106a receives requests from the local machine 102, forwards the requests to a second remote machine 106b and responds to the request by the local machine 102 with a response to the request from the remote machine 106b. In still another embodiment, the remote machine 106a acquires an enumeration of applications available to the local machine 102 and address information associated with a remote machine 106b hosting an application identified by the enumeration of applications. In yet another embodiment, the remote machine 106 presents the response to the request to the local machine 102 using a web interface. In one embodiment, the local machine 102 communicates directly with the remote machine 106 to access the identified application. In another embodiment, the local machine 102 receives output data, such as display data, generated by an execution of the identified application on the remote machine 106.

In some embodiments, the remote machine 106 or a server farm 38 may be running one or more applications, such as an application providing a thin-client computing or remote display presentation application. In one embodiment, the remote machine 106 or server farm 38 executes as an application any portion of the CITRIX ACCESS SUITE by Citrix Systems, Inc., such as the METAFRAME or CITRIX PRESENTATION SERVER products, any of the following products manufactured by Citrix Systems, Inc.: CITRIX XENAPP, CITRIX XENDESKTOP, CITRIX ACCESS GATEWAY, and/or any of the MICROSOFT WINDOWS Terminal Services manufactured by the Microsoft Corporation. In another embodiment, the application is an ICA client, developed by Citrix Systems, Inc. of Fort Lauderdale, Fla. In still another embodiment, the remote machine 106 may run an application, which, for example, may be an application server providing email services such as MICROSOFT EXCHANGE manufactured by the Microsoft Corporation of Redmond, Wash., a web or Internet server, or a desktop sharing server, or a collaboration server. In yet another embodiment, any of the applications may comprise any type of hosted service or products, such as GOTOMEETING provided by Citrix Online Division, Inc. of Santa Barbara, Calif., WEBEX provided by WebEx, Inc. of Santa Clara, Calif., or Microsoft Office LIVE MEETING provided by Microsoft Corporation of Redmond, Wash.

A local machine 102 may execute, operate or otherwise provide an application, which can be any type and/or form of software, program, or executable instructions such as any type and/or form of web browser, web-based client, client-server application, a thin-client computing client, an ActiveX control, or a Java applet, or any other type and/or form of executable instructions capable of executing on local machine 102. In some embodiments, the application may be a server-based or a remote-based application executed on behalf of the local machine 102 on a remote machine 106. In other embodiments, the remote machine 106 may display output to the local machine 102 using any thin-client protocol, presentation layer protocol, or remote-display protocol, such as the Independent Computing Architecture (ICA) protocol manufactured by Citrix Systems, Inc. of Ft. Lauderdale, Fla.; the Remote Desktop Protocol (RDP) manufactured by the Microsoft Corporation of Redmond, Wash.; the X11 protocol; the Virtual Network Computing (VNC) protocol, manufactured by AT&T Bell Labs; the SPICE protocol, manufactured by Qumranet, Inc., of Sunnyvale, Calif., USA, and of Raanana, Israel; the Net2Display protocol, manufactured by VESA, of Milpitas, Calif.; the PC-over-IP protocol, manufactured by Teradici Corporation, of Burnaby, B.C.; the TCX protocol, manufactured by Wyse Technology, Inc., of San Jose, Calif.; the THINC protocol developed by Columbia University in the City of New York, of New York, N.Y.; or the Virtual-D protocols manufactured by Desktone, Inc., of Chelmsford, Mass. The application can use any type of protocol and it can be, for example, an HTTP client, an FTP client, an Oscar client, or a Telnet client. In still other embodiments, the application comprises any type of software related to voice over Internet protocol (VoIP) communications, such as a soft IP telephone. In further embodiments, the application comprises any application related to real-time data communications, such as applications for streaming video and/or audio. In other embodiments, the application comprises any application related to computer-aided design (CAD), computer-aided manufacturing (CAM), computer-aided engineering (CAE), product life-cycle management (PLM), project management, resource management, customer relationship management (CRM), or any other application for the generation, modification, modeling, and/or analysis of data.

Figure 1B:
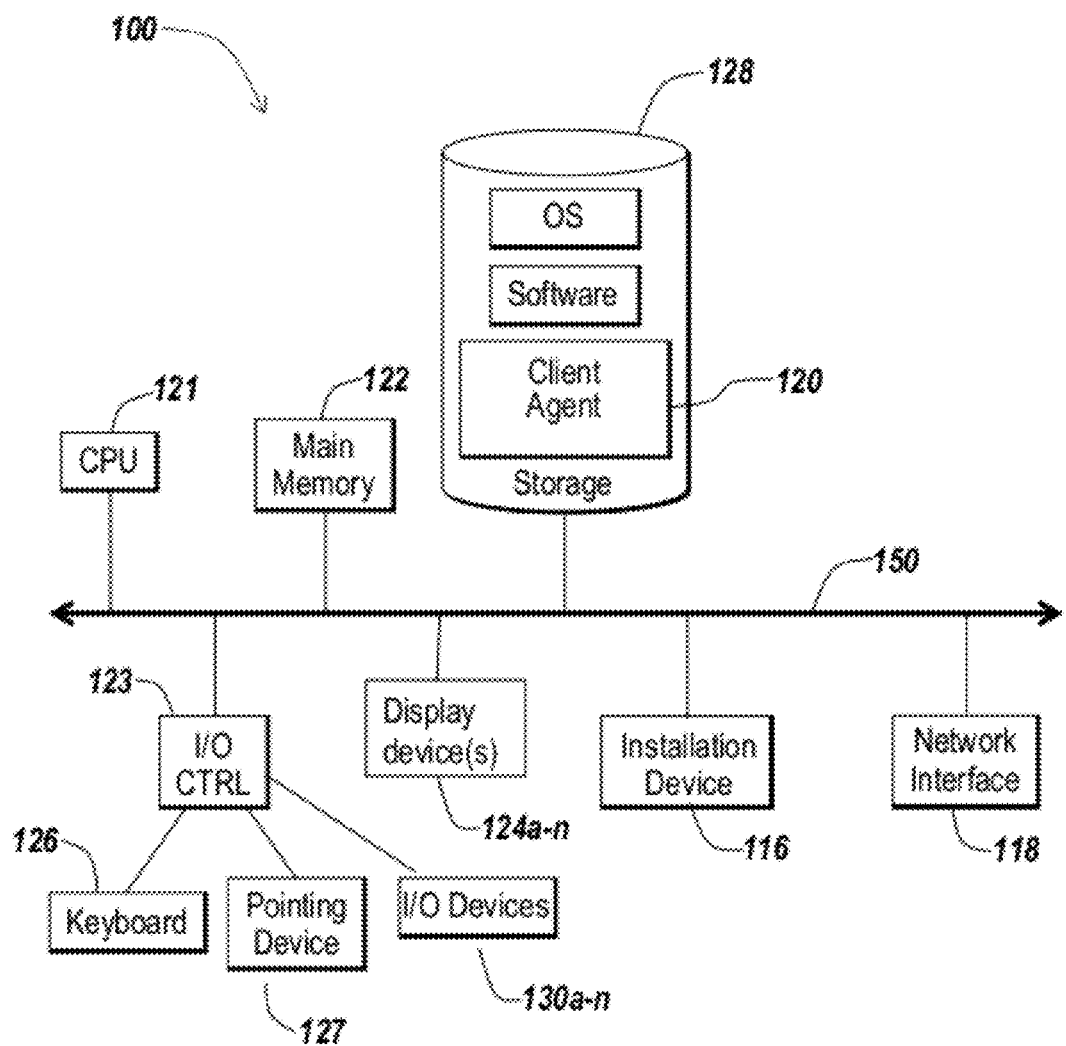
FIGS. 1B-1E are block diagrams depicting embodiments of computers useful in connection with the methods and systems described herein.
Figure 1C:
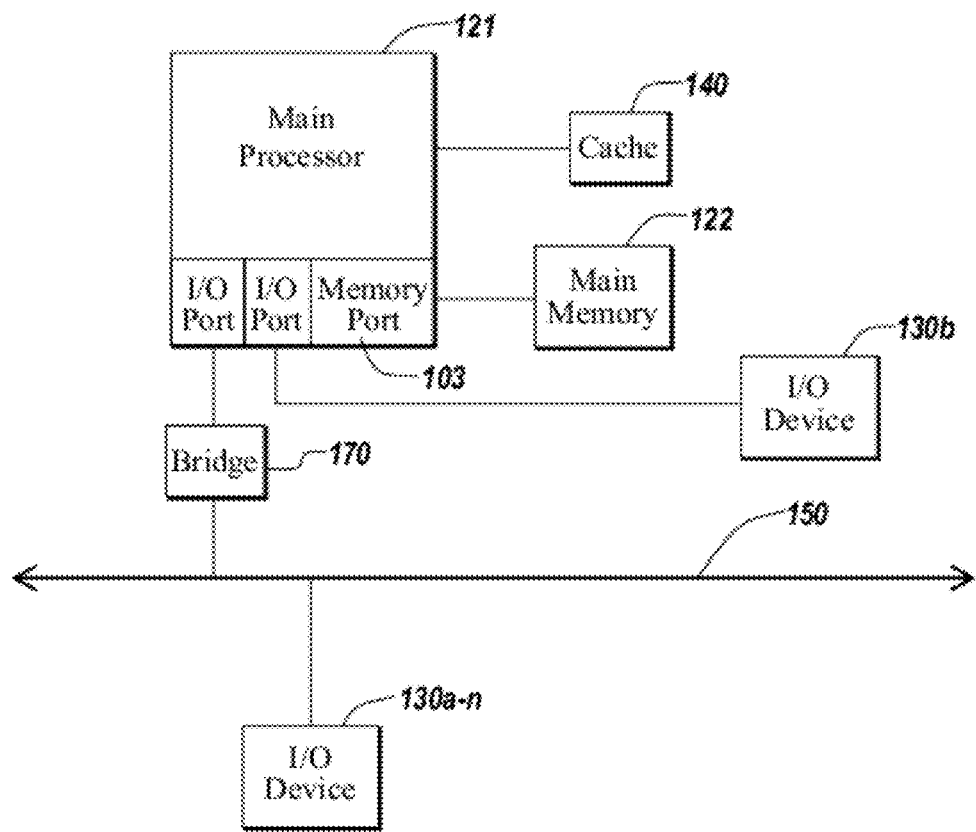

The local machine 102 and remote machine 106 may be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the local machine 102 or a remote machine 106. As shown in FIGS. 1B and 1C, each computing device 100 includes a central processing unit 121, and a main memory unit 122. As shown in FIG. 1B, a computing device 100 may include a storage device 128, an installation device 116, a network interface 118, an I/O controller 123, display devices 124a-n, a keyboard 126 and a pointing device 127, such as a mouse. The storage device 128 may include, without limitation, an operating system, software, and a client agent 120. As shown in FIG. 1C, each computing device 100 may also include additional optional elements, such as a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, Calif.; those manufactured by Motorola Corporation of Schaumburg, Ill.; those manufactured by Transmeta Corporation of Santa Clara, Calif.; the RS/6000 processor, those manufactured by International Business Machines of White Plains, N.Y.; or those manufactured by Advanced Micro Devices of Sunnyvale, Calif. The computing device 100 may be based on any of these processors, or any other processor capable of operating as described herein.

Main memory unit 122 may be one or more memory chips capable of storing data and allowing any storage location to be directly accessed by the microprocessor 121, such as Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDEC SRAM, PC100 SDRAM, Double Data Rate SDRAM (DDR SDRAM), Enhanced SDRAM (ESDRAM), SyncLink DRAM (SLDRAM), Direct Rambus DRAM (DRDRAM), or Ferroelectric RAM (FRAM). The main memory 122 may be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 may be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is typically provided by SRAM, BSRAM, or EDRAM. In the embodiment shown in FIG. 1B, the processor 121 communicates with various I/O devices 130 via a local system bus 150. Various buses may be used to connect the central processing unit 121 to any of the I/O devices 130, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 may use an Advanced Graphics Port (AGP) to communicate with the display 124. FIG. 1C depicts an embodiment of a computer 100 in which the main processor 121 communicates directly with I/O device 130b via HYPERTRANSPORT, RAPIDIO, or INFINIBAND communications technology. FIG. 1C also depicts an embodiment in which local busses and direct communication are mixed: the processor 121 communicates with I/O device 130a using a local interconnect bus while communicating with I/O device 130b directly.

A wide variety of I/O devices 130a-130n may be present in the computing device 100. Input devices include keyboards, mice, trackpads, trackballs, microphones, and drawing tablets. Output devices include video displays, speakers, inkjet printers, laser printers, and dye-sublimation printers. An I/O controller 123, as shown in FIG. 1B, may control the I/O devices. The I/O controller may control one or more I/O devices such as a keyboard 126 and a pointing device 127, e.g., a mouse or optical pen. Furthermore, an I/O device may also provide storage and/or an installation medium 116 for the computing device 100. In still other embodiments, the computing device 100 may provide USB connections (not shown) to receive handheld USB storage devices such as the USB Flash Drive line of devices manufactured by Twintech Industry, Inc. of Los Alamitos, Calif.

Referring again to FIG. 1B, the computing device 100 may support any suitable installation device 116, such as a floppy disk drive for receiving floppy disks such as 3.5-inch, 5.25-inch disks or ZIP disks, a CD-ROM drive, a CD-R/RW drive, a DVD-ROM drive, tape drives of various formats, USB device, hard-drive or any other device suitable for installing software and programs. The computing device 100 may further comprise a storage device, such as one or more hard disk drives or redundant arrays of independent disks, for storing an operating system and other related software, and for storing application software programs such as any program related to the client agent 120. Optionally, any of the installation devices 116 could also be used as the storage device. Additionally, the operating system and the software can be run from a bootable medium, for example, a bootable CD, such as KNOPPIX, a bootable CD for GNU/Linux that is available as a GNU/Linux distribution from knoppix.net.

Furthermore, the computing device 100 may include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS), or the Citrix Gateway Protocol manufactured by Citrix Systems, Inc. of Ft. Lauderdale, Fla. The network interface 118 may comprise a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 may comprise or be connected to multiple display devices 124a-124n, which each may be of the same or different type and/or form. As such, any of the I/O devices 130a-130n and/or the I/O controller 123 may comprise any type and/or form of suitable hardware, software, or combination of hardware and software to support, enable or provide for the connection and use of multiple display devices 124a-124n by the computing device 100. For example, the computing device 100 may include any type and/or form of video adapter, video card, driver, and/or library to interface, communicate, connect or otherwise use the display devices 124a-124n. In one embodiment, a video adapter may comprise multiple connectors to interface to multiple display devices 124a-124n. In other embodiments, the computing device 100 may include multiple video adapters, with each video adapter connected to one or more of the display devices 124a-124n. In some embodiments, any portion of the operating system of the computing device 100 may be configured for using multiple displays 124a-124n. In other embodiments, one or more of the display devices 124a-124n may be provided by one or more other computing devices, such as computing devices 100a and 100b connected to the computing device 100, for example, via a network. These embodiments may include any type of software designed and constructed to use another computer's display device as a second display device 124a for the computing device 100. One ordinarily skilled in the art will recognize and appreciate the various ways and embodiments that a computing device 100 may be configured to have multiple display devices 124a-124n.

In further embodiments, an I/O device 130 may be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a Fibre-Channel bus, or a Serial Attached small computer system interface bus.

A computing device 100 of the sort depicted in FIGS. 1B and 1C typically operates under the control of operating systems, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: WINDOWS 3.x, WINDOWS 95, WINDOWS 98, WINDOWS 2000, WINDOWS NT 3.51, WINDOWS NT 4.0, WINDOWS 7, WINDOWS CE, WINDOWS XP, and WINDOWS VISTA, all of which are manufactured by Microsoft Corporation of Redmond, Wash.; MAC OS, manufactured by Apple Inc., of Cupertino, Calif.; OS/2, manufactured by International Business Machines of Armonk, N.Y.; and Linux, a freely-available operating system distributed by Caldera Corp. of Salt Lake City, Utah, or any type and/or form of a Unix operating system, among others.

The computing device 100 can be any workstation, desktop computer, laptop or notebook computer, server, handheld computer, mobile telephone or other portable telecommunication device, media playing device, a gaming system, mobile computing device, or any other type and/or form of computing, telecommunications or media device that is capable of communication and that has sufficient processor power and memory capacity to perform the operations described herein. For example, the computing device 100 may comprise a device of the IPOD family of devices manufactured by Apple Inc., of Cupertino, Calif., a PLAYSTATION 2, PLAYSTATION 3, or PERSONAL PLAYSTATION PORTABLE (PSP) device manufactured by the Sony Corporation of Tokyo, Japan, a NINTENDO DS, NINTENDO GAMEBOY, NINTENDO GAMEBOY ADVANCED or NINTENDO REVOLUTION device manufactured by Nintendo Co., Ltd., of Kyoto, Japan, or an XBOX or XBOX 360 device manufactured by the Microsoft Corporation of Redmond, Wash.

In some embodiments, the computing device 100 may have different processors, operating systems, and input devices consistent with the device. For example, in one embodiment, the computing device 100 is a TREO 180, 270, 600, 650, 680, 700p, 700w/wx, 750, 755p, 800w, Centro, or Pro smart phone manufactured by Palm, Inc. In some of these embodiments, the TREO smart phone is operated under the control of the PalmOS operating system and includes a stylus input device as well as a five-way navigator device.

In other embodiments the computing device 100 is a mobile device, such as a JAVA-enabled cellular telephone or personal digital assistant (PDA), such as the i55sr, i58sr, i85s, i88s, i90c, i95c1, i335, i365, i570, 1576, i580, i615, i760, i836, i850, i870, i880, i920, i930, ic502, ic602, ic902, i776 or the im1100, all of which are manufactured by Motorola Corp. of Schaumburg, Ill., the 6035 or the 7135, manufactured by Kyocera of Kyoto, Japan, or the i300 or i330, manufactured by Samsung Electronics Co., Ltd., of Seoul, Korea. In some embodiments, the computing device 100 is a mobile device manufactured by Nokia of Finland, or by Sony Ericsson Mobile Communications AB of Lund, Sweden.

In still other embodiments, the computing device 100 is a Blackberry handheld or smart phone, such as the devices manufactured by Research In Motion Limited, including the Blackberry 7100 series, 8700 series, 7700 series, 7200 series, the Blackberry 7520, the Blackberry PEARL 8100, the 8700 series, the 8800 series, the Blackberry Storm, Blackberry Bold, Blackberry Curve 8900, and the Blackberry Pearl Flip. In yet other embodiments, the computing device 100 is a smart phone, Pocket PC, Pocket PC Phone, or other handheld mobile device supporting Microsoft Windows Mobile Software. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

In some embodiments, the computing device 100 is a digital audio player. In one of these embodiments, the computing device 100 is a digital audio player such as the Apple IPOD, IPOD Touch, IPOD NANO, and IPOD SHUFFLE lines of devices, manufactured by Apple Inc., of Cupertino, Calif. In another of these embodiments, the digital audio player may function as both a portable media player and as a mass storage device. In other embodiments, the computing device 100 is a digital audio player such as the DigitalAudioPlayer Select MP3 players, manufactured by Samsung Electronics America, of Ridgefield Park, N.J., or the Motorola m500 or m25 Digital Audio Players, manufactured by Motorola Inc. of Schaumburg, Ill. In still other embodiments, the computing device 100 is a portable media player, such as the Zen Vision W, the Zen Vision series, the Zen Portable Media Center devices, or the Digital MP3 line of MP3 players, manufactured by Creative Technologies Ltd. In yet other embodiments, the computing device 100 is a portable media player or digital audio player supporting file formats including, but not limited to, MP3, WAV, M4A/AAC, WMA Protected AAC, AIFF, Audible audiobook, Apple Lossless audio file formats and .mov, .m4v, and .mp4 MPEG-4 (H.264/MPEG-4 AVC) video file formats.

In some embodiments, the computing device 100 comprises a combination of devices, such as a mobile phone combined with a digital audio player or portable media player. In one of these embodiments, the computing device 100 is a Motorola RAZR or Motorola ROKR line of combination digital audio players and mobile phones. In another of these embodiments, the computing device 100 is a device in the iPhone line of smartphones, manufactured by Apple Inc., of Cupertino, Calif.

In one embodiment, a computing device 102a may request resources from a remote machine 106, while providing the functionality of a remote machine 106 to a client 102b. In such an embodiment, the computing device 102a may be referred to as a client with respect to data received from the remote machine 106 (which may be referred to as a server) and the computing device 102a may be referred to as a server with respect to the second client 102b. In another embodiment, the client 102 may request resources from the remote machine 106 on behalf of a user of the client 102.

Figure 1D:
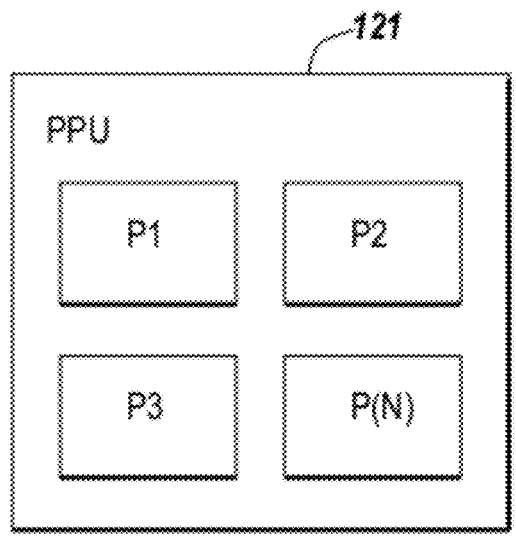

As shown in FIG. 1D, the computing device 100 may comprise multiple processors and may provide functionality for simultaneous execution of instructions or for simultaneous execution of one instruction on more than one piece of data. In some embodiments, the computing device 100 may comprise a parallel processor with one or more cores. In one of these embodiments, the computing device 100 is a shared memory parallel device, with multiple processors and/or multiple processor cores, accessing all available memory as a single global address space. In another of these embodiments, the computing device 100 is a distributed memory parallel device with multiple processors each accessing local memory only. In still another of these embodiments, the computing device 100 has both some memory which is shared and some memory which can only be accessed by particular processors or subsets of processors. In still even another of these embodiments, the computing device 100, such as a multicore microprocessor, combines two or more independent processors into a single package, often a single integrated circuit (IC). In yet another of these embodiments, the computing device 100 includes a chip having a CELL BROADBAND ENGINE architecture and including a Power processor element and a plurality of synergistic processing elements, the Power processor element and the plurality of synergistic processing elements linked together by an internal high speed bus, which may be referred to as an element interconnect bus.

In some embodiments, the processors provide functionality for execution of a single instruction simultaneously on multiple pieces of data (SIMD). In other embodiments, the processors provide functionality for execution of multiple instructions simultaneously on multiple pieces of data (MIMD). In still other embodiments, the processor may use any combination of SIMD and MIMD cores in a single device.

Figure 1E:
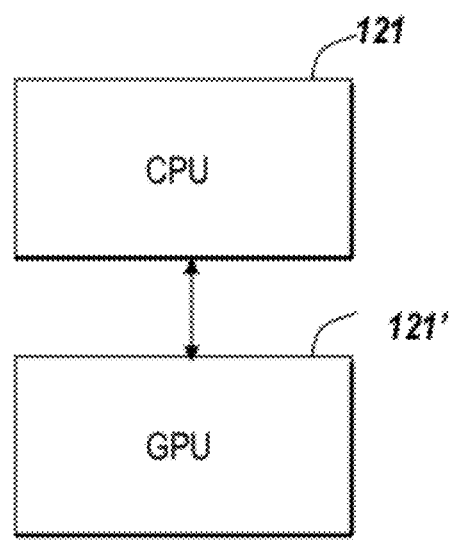

In some embodiments, the computing device 100 may comprise a graphics processing unit. In one of these embodiments, depicted in FIG. 1E, the computing device 100 includes at least one central processing unit 121 and at least one graphics processing unit. In another of these embodiments, the computing device 100 includes at least one parallel processing unit and at least one graphics processing unit. In still another of these embodiments, the computing device 100 includes a plurality of processing units of any type, one of the plurality of processing units comprising a graphics processing unit.

In one embodiment, a resource may be a program, an application, a document, a file, a plurality of applications, a plurality of files, an executable program file, a desktop environment, a computing environment, or other resource made available to a user of the local computing device 102. The resource may be delivered to the local computing device 102 via a plurality of access methods including, but not limited to, conventional installation directly on the local computing device 102, delivery to the local computing device 102 via a method for application streaming, delivery to the local computing device 102 of output data generated by an execution of the resource on a third computing device 106b and communicated to the local computing device 102 via a presentation layer protocol, delivery to the local computing device 102 of output data generated by an execution of the resource via a virtual machine executing on a remote computing device 106, or execution from a removable storage device connected to the local computing device 102, such as a USB device, or via a virtual machine executing on the local computing device 102 and generating output data. In some embodiments, the local computing device 102 transmits output data generated by the execution of the resource to another client computing device 102b.

In some embodiments, a user of a local computing device 102 connects to a remote computing device 106 and views a display on the local computing device 102 of a local version of a remote desktop environment, comprising a plurality of data objects, generated on the remote computing device 106. In one of these embodiments, at least one resource is provided to the user by the remote computing device 106 (or by a second remote computing device 106b) and displayed in the remote desktop environment. However, there may be resources that the user executes on the local computing device 102, either by choice, or due to a policy or technological requirement. In another of these embodiments, the user of the local computing device 102 would prefer an integrated desktop environment providing access to all of the resources available to the user, instead of separate desktop environments for resources provided by separate machines. For example, a user may find navigating between multiple graphical displays confusing and difficult to use productively. Or, a user may wish to use the data generated by one application provided by one machine in conjunction with another resource provided by a different machine. In still another of these embodiments, requests for execution of a resource, windowing moves, application minimize/maximize, resizing windows, and termination of executing resources may be controlled by interacting with a remote desktop environment that integrates the display of the remote resources and of the local resources. In yet another of these embodiments, an application or other resource accessible via an integrated desktop environment—including those resources executed on the local computing device 102 and those executed on the remote computing device 106—is shown in a single desktop environment.

In one embodiment, data objects from a remote computing device 106 are integrated into a desktop environment generated by the local computing device 102. In another embodiment, the remote computing device 106 maintains the integrated desktop. In still another embodiment, the local computing device 102 maintains the integrated desktop.

In some embodiments, a single remote desktop environment 204 is displayed. In one of these embodiments, the remote desktop environment 204 is displayed as a full-screen desktop. In other embodiments, a plurality of remote desktop environments 204 is displayed. In one of these embodiments, one or more of the remote desktop environments are displayed in non-full-screen mode on one or more display devices 124. In another of these embodiments, the remote desktop environments are displayed in full-screen mode on individual display devices. In still another of these embodiments, one or more of the remote desktop environments are displayed in full-screen mode on one or more display devices 124.

B. Systems and Methods for Using a Direct Computer-Aided Design Modeling User Interface for Creating and Modifying a Parametric Computer-Aided Design Model Two approaches for developing three-dimensional designs are currently widely used: direct and parametric computer-aided design (CAD) modeling. Both approaches have some inherent advantages and disadvantages, and accordingly, users have typically selected one approach or the other depending on application.

Figure 2A:
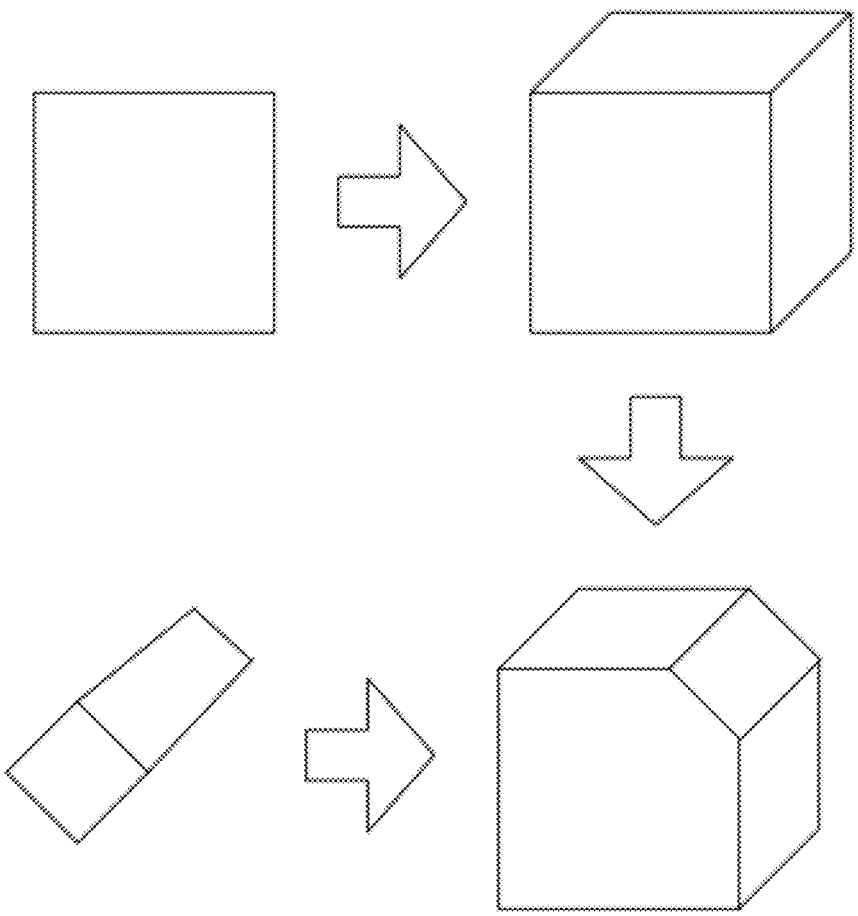
FIG. 2A is a block diagram of an embodiment of creation of a chamfered three-dimensional object through direct modeling.

In brief, direct modeling allows for easy and quick creation of three-dimensional designs, and modification through direct, on-the-fly interactions with the model geometry. Results are displayed in an intuitive what-you-see-is-what-you-get (WYSIWYG) format. As a result, direct modeling is easy to learn and allows for fast creation of complex models. For example, referring to FIG. 2A, shown is a block diagram of an embodiment of creation of a chamfered three-dimensional object through direct modeling. A user may create a two-dimensional square and pull the square into a three-dimensional cube. The user may also create another three-dimensional prism, oriented at a 45 degree diagonal to the cube. The user may then position the prism overlapping a corner of the cube, and perform a Boolean subtraction to create a chamfered edge. Other methods of creating chamfers exist, including adding construction lines along the top and side faces, diagonal construction lines along the front and back faces, and subtracting the region bounded by these lines.

In direct modeling, geometric manipulations are performed directly on the model. Accordingly, engineers need not consider design intent and associations of elements. This may allow for rapid development cycles and quick creation of custom or one-off products, as well as construction of very large, highly detailed assemblies: because the CAD system need not store relationships between entities and calculate relative geometry, models can take up less space in memory, and performance may be much faster because only graphics information needs to be calculated, and no model dependencies must be calculated and solved.

In parametric modeling, sometimes referred to as associative parametric modeling, feature-based modeling, or history-based modeling, geometry is created through a two-step process. The user defines geometry construction recipes through the use of feature constructs, including extrusions, holes, cuts, fillets, chamfers, rounds, and others. The parametric geometry engine interprets these recipes and creates the geometry of the model for display by a modeling and/or display engine. These recipes may sometimes be referred to as feature histories, and may comprise a sequence of the different combinations of features utilized in modeling a final modeled object as the modeled object is designed.

Figure 2B:
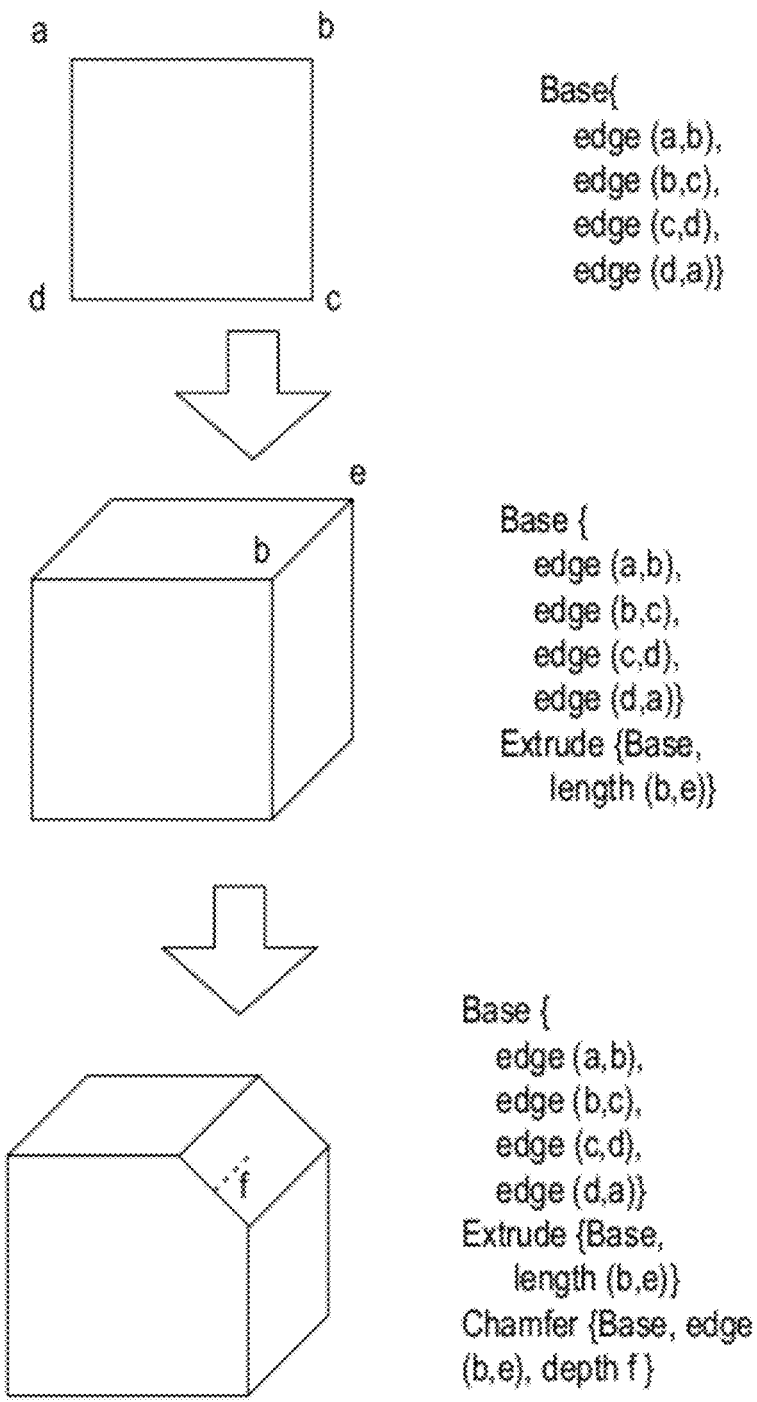
FIG. 2B is a block diagram of an embodiment of creation of a chamfered three-dimensional object through parametric modeling.

For example, shown in FIG. 2B is a block diagram of an embodiment of creation of a chamfered three-dimensional object through parametric modeling. A user first defines a square through associations of multiple edges. In some embodiments, as shown, edges may be defined through an association of two vertices, while in other embodiments, edges may be defined through relative position, size and angle to another edge; by a vertex, and length and direction of a vector; or by any other means. In some embodiments, the user may sketch the square, and the parametric geometry engine may interpret the geometry as an association of edges and vertices.

The user then defines an extrusion of the square along a direction perpendicular to the face of the object. In some embodiments, the length of the extrusion may be defined by another vertex, an explicit length, or by any other means. Finally, in the embodiment shown, the user creates a chamfer by defining the chamfer in terms of an object, edge, and depth. At one or more steps in the process, a modeling or display engine interprets the instruction list or recipe to create the displayed model.

Unlike direct modeling, because parametric modeling stores an order of operations or history, relationships between features may be defined. Accordingly, changing the order of features in the recipe may have dramatic effects on the model, unlike in direct modeling, where the order of element creation is irrelevant. However, this approach allows a user to edit an earlier feature in the instruction list, and the geometry engine will recalculate the effects through the model. For example, in a parametric CAD modeler, if a user creates an extruded plate and defines a hole as centered on the midpoint of an axis of the plate and later changes the dimensions of the plate, the geometry engine may move the hole to remain centered on the midpoint. However, in a direct CAD modeler, stretching a face of the plate after placing the hole may result in the hole not moving and being located off-center.

In another example, angular relationships may be defined in parametric CAD modelers, such as a line being defined as perpendicular to a tangent of a circle, i.e. in a direction along a line through the center of the circle and the tangent point. If the position of the circle is modified, the angle or position of the line may be correspondingly modified. However, in a direct CAD modeler, because this history is not maintained, moving the circle may result in no change to position or angle of the line, causing it to no longer be perpendicular to the circle.

Although referred to herein as direct modeling, this technique is sometimes called explicit modeling. One of skill in the art can appreciate that, regardless of the term used, direct or explicit modeling is a geometry-based paradigm for direct manipulation of geometry, agnostic or ignorant of design intent, history, and associative relationships. Direct modeling should not be confused with direct design manipulation, which refers to manually pushing, pulling, or modifying geometry as opposed to entering data into a dialog box to edit geometry, sometimes referred to as indirect design manipulation. Direct design manipulation and indirect, or dialog box, design manipulation thus refer to methods of inputting data in a user interface; while direct or explicit modeling and parametric modeling thus refer to a modeling paradigm.

Due to the added complexity of parametric CAD modeling, the learning curve for a user is often steeper. However, automation may be used to control modifications to model elements, allowing the creation of many different variations on a single design.

Combining direct and parametric modelers is difficult, because parametric modeling relies on regeneration of a history-based construction recipe, while direct modeling relies only on the geometry directly created by the user and ignores order of creation. Accordingly, the different methods require different underlying architecture. Prior attempts at interoperability of direct and parametric modelers have relied on importing and translation of models. However, because of the architectural differences, these translations result in losses of information: history and associative relationships are lost when importing a parametric model into a direct modeler, and product manufacturing information is lost when a geometry-based direct model is imported into a parametric model. For example, annotations or labels on a model in a direct modeling user interface, such as notes regarding machining of surfaces, paint types or colors, or manufacturing processes, do not correspond to features. Because many translators only consider the geometry of the model, these annotations may be lost when converting a direct model to a parametric model. Similarly, engineering associations between a plurality of surfaces or features in a parametric design, such as a hole axially overlapping another hole to form a counterbore hole, may be lost when converted to a direct model. Accordingly, a user of a typical direct modeler may modify a position of the overlapping hole without moving the bolt hole, breaking the association.

Additionally, losses of geometric fidelity can occur during transfers. For example, due to truncation or rounding of position data, an object that may be constrained to contact with a second object in a parametric modeler may be placed slightly apart from the second object when imported into a direct modeler.

In one aspect of the present invention, a direct modeling user interface is used for editing a model, allowing intuitive and easy manipulation of geometry, and a parametric geometry engine interprets these manipulations as history-based features to create a construction recipe. Thus, the underlying architecture of the model remains parametric, but even though the user may not realize that history and associative relationships are being created and modified during every manipulation. Accordingly, the present invention provides the intuitive WYSIWYG editing of direct CAD modeling, while retaining the powerful features and regenerative capabilities of parametric modelers.

In one embodiment, the parametric geometry engine can recognize various direct modeling manipulations by mapping simple manipulations to traditional features. For example, pulling a face of an object may be mapped to an extrusion, pushing a subsection of a face may be mapped to a hole, a follow-me type extrusion may be mapped to a sweep, etc. However, many direct modeling manipulations are not interpretable as traditional parametric history-based features, such as moving a surface in such a way that the topology of the surrounding geometry has to change. For example, while it may be easy to interpret a square pulled into a cube as an extruded face, rotating the top face to form a twisted prism may be difficult to interpret parametrically. Similarly, a first figure can be swept along a curved edge and recognized as a sweep feature, but if the curved edge is then modified, a parametric association between the edge and the sweep may be broken.

Accordingly, in one embodiment, the parametric geometry engine may map these non-traditional features to a non-traditional, "flexible" feature, termed a flex move feature. A flex move feature may comprise a parametric feature or a combination of parametric features or sub-features, and may be placed in a parametric history or recipe like any other feature. The flex move feature may be a child of a prior feature or have other dependencies, and later features may be children of the flex move feature. In one embodiment, the flex move feature may comprise an ordered set of rigid translations and rotations of a set of entities or surfaces, a set of modifiable dimensions, or a set of assembly constraints that fully define the position and orientation of the geometry selection.

In a further embodiment, the flex move feature may indicate to delete geometry from a position prior to the ordered translations or rotations. For example, in one embodiment in which a first object intersecting a second object along an intersection line is moved away from the second object, the flex move feature may cause the parametric geometry engine to delete the intersection line after the move. This prevents geometry caused by the prior location of the moved entity from leaving artifacts behind. In a still further embodiment, the flex move feature may indicate to close openings left in surfaces or edges or other solid entities due to the deletion or movement of the geometry. For example, moving an object from a prior position intersecting a second solid object may result in a hole being left in a surface of the second solid object. The flex move feature may cause the parametric geometry engine to close this hole. In some embodiments, the flex move feature may act on a surface, a collection of surfaces within a solid geometrical entity, or a collection of surfaces belonging to a quilt. In other embodiments, the flex move feature may act on planes, axes, points, complex systems, or combinations of any of these.

In a further embodiment, movement of geometric entities may cause the parametric geometry engine to create or modify the geometry of the moved entities or neighboring entities to re-attach the moved entities to the model. For instance, moving an edge to a position apart from a surface may cause the parametric geometry entity to extend the edge and/or surface, create tangent lines of curves, or create non-tangential straight lines to reconnect and close the intervening space in a solid surface or object.

In a similar embodiment, the parametric geometry engine may map a non-traditional feature to a new feature termed a flex move copy feature, or sometimes a flex copy feature. The flex move copy feature may comprise a parametric feature similar to a flex move feature, identifying translations and rotations of geometric entities, but without deleting geometry from the prior position of the entities.

In many embodiments, flex move and flex move copy features may be placed in a parametric feature history. In one embodiment, these features may be placed as dependent or child features of the geometry on which they act. In a further embodiment, further modifications to the moved or copied geometry, including traditional features such as extrusions, revolves, sweeps, or others, or further moves or copies, may be created as dependent or child features of the flex feature. Accordingly, this allows the parametric geometry engine to properly regenerate and recalculate geometry as a user makes changes throughout the parametric recipe.

In some embodiments, the parametric geometry engine may map relationships created in the direct modeling user interface to parametric features. For example, in one such embodiment, a user may create a symmetric or mirrored copy of a geometric entity or entities. The parametric geometry engine may interpret this as creation of a flexible symmetric feature. A flexible symmetric feature may comprise a group header feature for a plurality of symmetric or mirrored entities, and an identification of a plane of symmetry. Because of the association between the entities in the parametric feature list, the parametric engine may later apply an edit to one entity to the symmetric or mirrored entity automatically during recalculation or regeneration. This frequently cannot be done with systems that import and translate direct models into parametric systems, because without knowledge of the explicit step of mirroring that was performed during the direct model editing, these parametric systems do not know to constrain an object or set of objects to be symmetric or mirrored to a second object or set of objects, and may simply interpret the second object or set of objects as new, unassociated (but coincidentally similar) objects. In other embodiments, the parametric geometry engine may interpret the symmetric or mirrored entities as a traditional mirror feature.

In a similar embodiment, the user may create a pattern of geometric entities, such as a pattern of evenly spaced holes around a disc. Again, systems that simply import and translate direct models into parametric systems may not be able to interpret these entities as a common pattern of holes, and may identify each hole as a distinct and unrelated feature. By having knowledge of an explicit pattern creation step in the direct modeling user interface, the parametric engine of the present invention can create a flexible pattern feature. The flexible pattern feature may comprise a group header feature for a plurality of flex move copy features; or a pattern of related and associated members, such that modification to one member propagates the modification to all other members. In other embodiments, the parametric geometry engine may interpret the pattern of geometric entities as a traditional pattern feature.

As a further result of retaining history and dependencies and using a parametric model for creation and modification of these non-traditional entities, the user is accorded with the ability to track changes on a granular level. This is unlike traditional methods of importing direct modeling edits into a parametric modeler. In these systems, change-tracking can be performed only by comparing a prior saved state of the model by the parametric modeler to the imported state of the model—essentially comparing the entire geometry of a first version of a part to a second version of the part. These systems typically do not allow a user to accept or reject a change to a portion or sub-component of the part, because the system may lack the ability to remember changes on an individual level. Some versions of these systems allow only overall approval or rejection of the direct modeling edits, while others may do limited comparisons to detect traditional features such as extrusions or sweeps and allow some basic subdivisions of edits for approval or rejection. However, because history and dependencies are lost in these systems, changes cannot be tracked on a granular, individual-edit level. For example, a user may be able to incongruously approve generation of a hole while rejecting the surface in which the hole is cut. In another example, in many embodiments, a designer using a parametric system may arrive at an end geometry for a part through any of several different operations. Features that are not dependent upon each other may, in some embodiments, be created in any order—a sweep may be applied on one part of a model and an extrude on another part, or the extrude may be created first followed by the sweep. The order of creation may be representative of the intent of the designer. However, because order is not recorded in a direct modeling system, this representation of intent may be lost when translating the model between parametric and direct systems, even where individual features are recognized.

Because the system of the present invention acts on a parametric modeling paradigm at all times, even with a direct modeling user interface, feature dependencies can be preserved and change tracking can be performed on an edit-by-edit basis. Accordingly, in one embodiment, a user of a parametric modeling user interface may review, accept, and reject individual changes or modifications made to a model by a user of a direct modeling user interface without having to import the model after each change. In a further embodiment, the user of the parametric modeling user interface may reject a modification made by the user of the direct modeling interface to a first object, and responsive to the rejection and a dependent relationship of a second object to the first object, the geometry engine may recalculate geometry of the second object.

As discussed above, in moving models between direct modeling systems and parametric modeling systems, product manufacturing information may be lost. Another result of the system of the present invention is that such information is retained, because no translations are performed moving between the direct modeling user interface and parametric modeling user interface. Labels and annotations are linked to existent features, so no confusion arises from attempting to link an ambiguous label or annotation from a direct model with no relationships or dependencies to a feature in a parametric model.

Figure 3A:
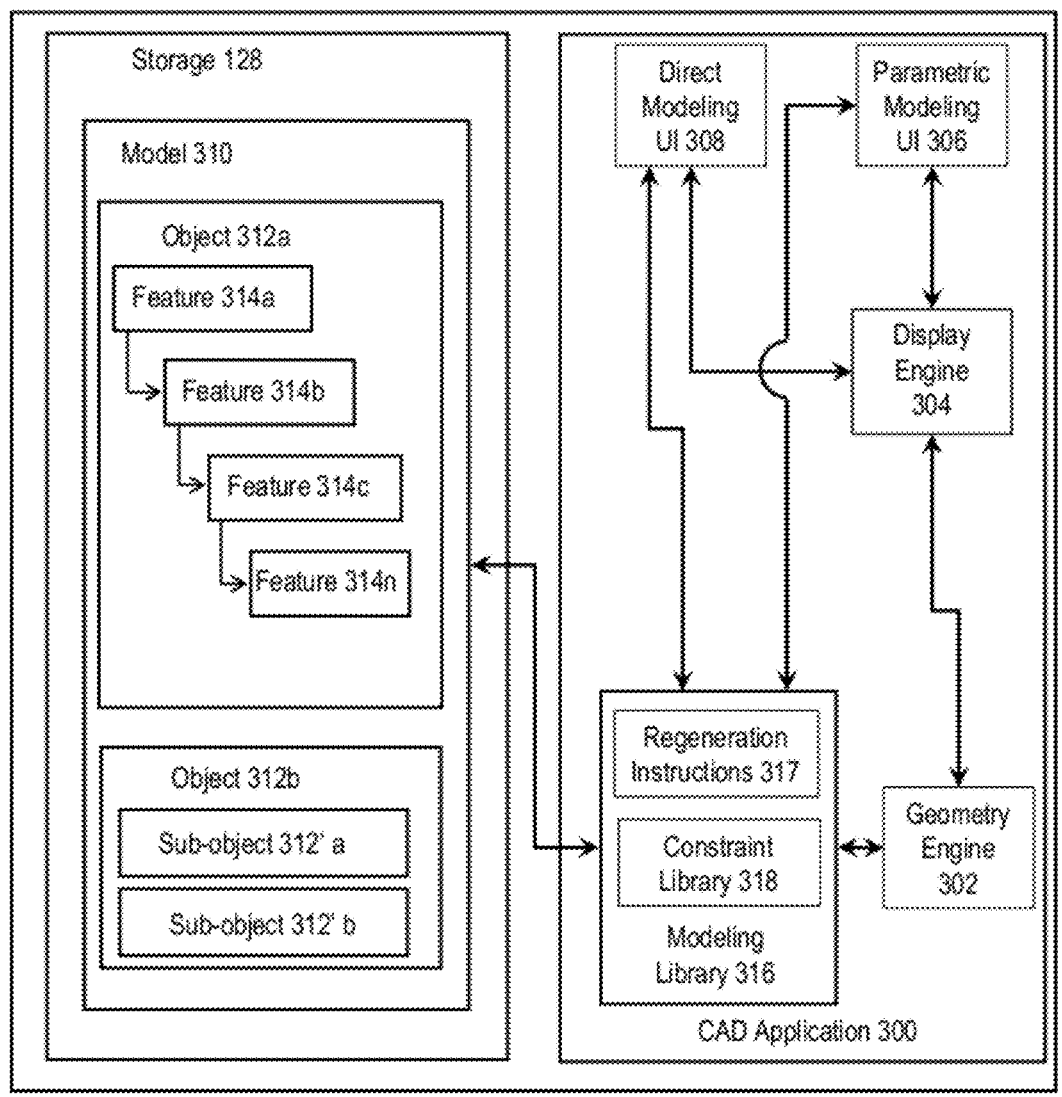
FIG. 3A is a block diagram of an embodiment of a system for computer-aided design.

Referring now to FIG. 3A, shown is a block diagram of an embodiment of a system for computer-aided design. In brief overview, a computing device 100 may include or connect to storage 128. Although shown internal to computing device 100, in many embodiments, storage 128 may comprise a network storage device or external storage device. Storage device 128 may include one or more models 310, which may include one or more objects 312a and 312b, referred to generally as objects 312. In some embodiments, an object may comprise one or more features 314a-314n (referred to generally as features 314) which may comprise a history-based or ordered construction recipe. In one embodiment, a first feature may be a child of a second feature, or conversely the second feature may be a parent of the first feature. In some embodiments, a feature may be referred to as a child of a parent feature if it is dependent upon the parent feature for some aspect of its geometry or other data. In some embodiments, an object may comprise one or more sub-objects 312'a or 312'b, referred to generally as sub-objects 312'. In some embodiments, a sub-object 312' may comprise further sub-objects and/or one or more features 314. Computing device 100 may execute or communicate with a CAD application 300.

Still referring to FIG. 3A and in more detail, in one embodiment, a computing device 100 executes a CAD application 300. Although referred to as a CAD application, in many embodiments, the application may comprise a CAM application, CAE application, or other application for two or three-dimensional design, modeling, or analysis. CAD application 300 may comprise a program, application, service, sub-routine, or other executable logic for creating, modifying, analyzing, and modeling two or three-dimensional geometry. CAD application 300 may be used for engineering, manufacturing, architectural, animation, modeling, artistic, or other design or manufacturing functions.

In many embodiments, CAD application 300 may comprise one or more of a geometry engine 302, a display engine 304, a parametric modeling user interface (UI) 306, a direct modeling UI 308, a modeling library 316, regeneration instructions 317, and a constraint library 318. In one embodiment, modeling library 317 may comprise a library, API, or other database of executable routines to enable the creation and evaluation of CAD geometry. In some embodiments, modeling library 316 may contain the feature history and model deltas of a model 310 or object 312. For example, as the design process of a modeled object evolves, the feature history may be sequentially established and stored by the modeling library 316. In many embodiments, modeling library 316 may be considered part of storage 128 and accessed by CAD application 300.

In another embodiment, CAD application 300 may comprise a constraint library 318, which may function in conjunction with the modeling library 316. Constraint library 318 may comprise a library of functions for controlling the governing dimensions and parameters of a design, driving the placement of assembly components and interrelating objects. For example, when a project is initiated or during the design process, certain project constraints can be provided for the modeled object. These constraints can include dimensional constraints, material constraints, weight constraints, strength constraints, or any other type of constraints. The constraint library 318 may be used to monitor the design process and guide the placement and characteristics of the features as they are added to the modeled object to ensure the final result fits within a predetermined specification.

CAD application 300 may also include a library of regeneration instructions 317, which may work in conjunction with the modeling library 316 and constraint library 318. Regeneration instructions 316 may utilize the constraint library 318 to specify the location of features and then construct the features specified in the modeling library 316.

The geometry engine 302 of CAD application 300 may comprise an agent, program, service, routine, logic, or other executable functions for executing parametric functions and instructions in the libraries 316-318. Geometry engine 302 may comprise hardware, software, or a combination of hardware and software. For example, in one embodiment, geometry engine 302 may comprise dedicated processing units for executing CAD functions and features. In one embodiment, geometry engine 302 may utilize modeling library 316 as an application programming interface (API) for generating or recalculating geometry or other features of a model 310.

CAD application 300 may include a display engine 304. Display engine 304 may comprise an agent, program, service, routine, logic, or other executable functions for rendering and outputting or displaying three-dimensional surfaces and objects. In some embodiments, display engine 304 may comprise functionality for ray tracing, scan-line rendering, raycasting, shading, texture mapping, or other functions for generating realistic or non-realistic graphics.

In some embodiments, CAD application 300 may include either or both of a parametric modeling UI 306 and a direct modeling UI 308. As discussed above, parametric modeling user interfaces show a historical recipe or instruction set of features, and relationships or dependencies between these features. The user is aware of features that they create, and regeneration and dependencies are made obvious and apparent to the user. By contrast, a direct modeling user interface does not display a history, recipe or features.

As discussed above, in some embodiments, the user may use a direct modeling UI 308 to interact with geometry of a model, and the interactions are interpreted by the history-based geometry engine 302 as features. Thus, in these embodiments, a single geometry engine may be used for both the parametric modeling UI and the direct modeling UI.

Furthermore, in some embodiments and as discussed above, because of the history recorded by the underlying parametric geometry engine, changes made in the direct modeling UI can be tracked and undone in the parametric modeling UI on an individual-change basis, which may not be possible in other systems that let a user interact with a model through a direct modeling UI and engine and then import and translate all of the changes in a parametric engine at once. Accordingly, different users in an organization can use different paradigms, direct or parametric, without losing any data fidelity as models are passed between different user interfaces.

Figure 3B:
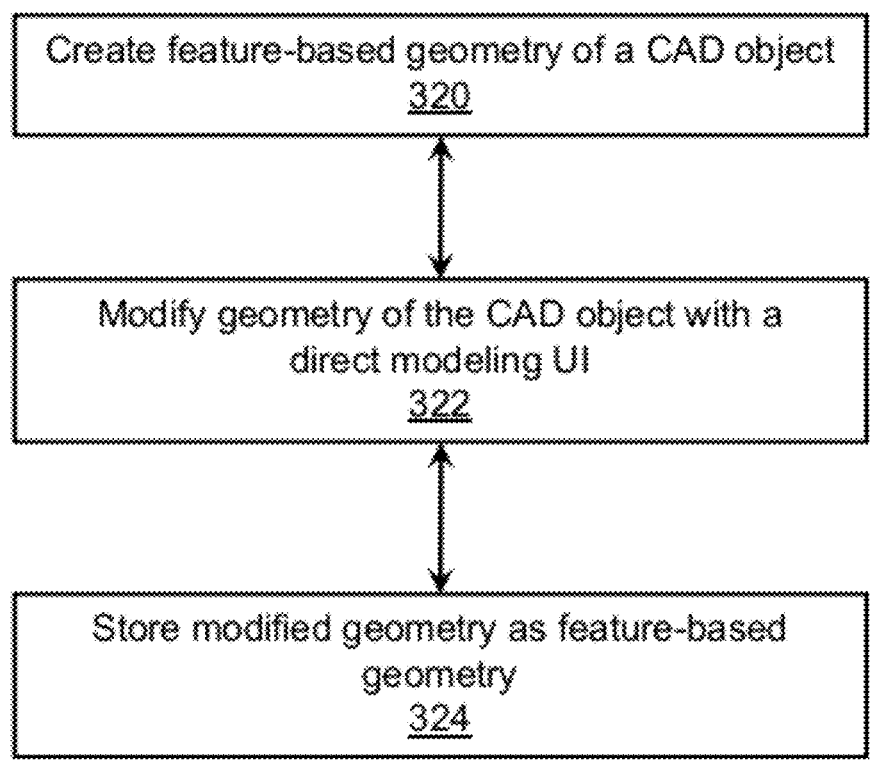
FIG. 3B is a flow chart of an embodiment of a method of computer-aided design.

Referring now to FIG. 3B, shown is a flow chart of an embodiment of a method of computer-aided design. In brief overview, at step 320, a user may create feature-based geometry of a CAD object using a CAD application. At step 322, the user may modify geometry of the CAD object with a direct modeling user interface (UI). At step 324, the CAD application may store the modified geometry as feature-based geometry.

Still referring to FIG. 3B and in more detail, in some embodiments at step 320, a user may use a CAD application executed by a processor of a computing device to create a recipe of feature-based geometry of a CAD object or model.

At step 322, in some embodiments, the user may use a direct modeling user interface of the CAD application to modify geometry of the CAD object or model. In some embodiments, the direct modeling user interface hides history and/or parametric features of the CAD object or model from the user. Accordingly, in one embodiment, the user may be unaware that a modification of the CAD object or model in the direct modeling UI may cause creation and/or modification of a parametric CAD object and/or dependencies or relationships with other objects, elements, or components.

At step 324, in one embodiment, the CAD application may store the modified geometry as parametric features or modifications to parametric features of the CAD object. In some embodiments, the CAD application may store the modified geometry as one or more traditional parametric features, such as sweeps, revolves, holes, cuts, extrudes, or similar features. In other embodiments, the CAD application may store the modified geometry as one or more flexible parametric features, such as a flex move or flex move copy feature. In still other embodiments, the CAD application may store the modified geometry as a combination of traditional and flexible parametric features. In many embodiments, the CAD application may store one or more relationships or dependencies between the modified geometry feature or features and one or more existing geometry features, such as through a history or tree dependency representation.

In a further embodiment, the CAD application may regenerate geometry data of other objects with dependencies on the modified object. In another further embodiment, the CAD application may direct a display engine to render or display regenerated geometry data.

Figure 3C:
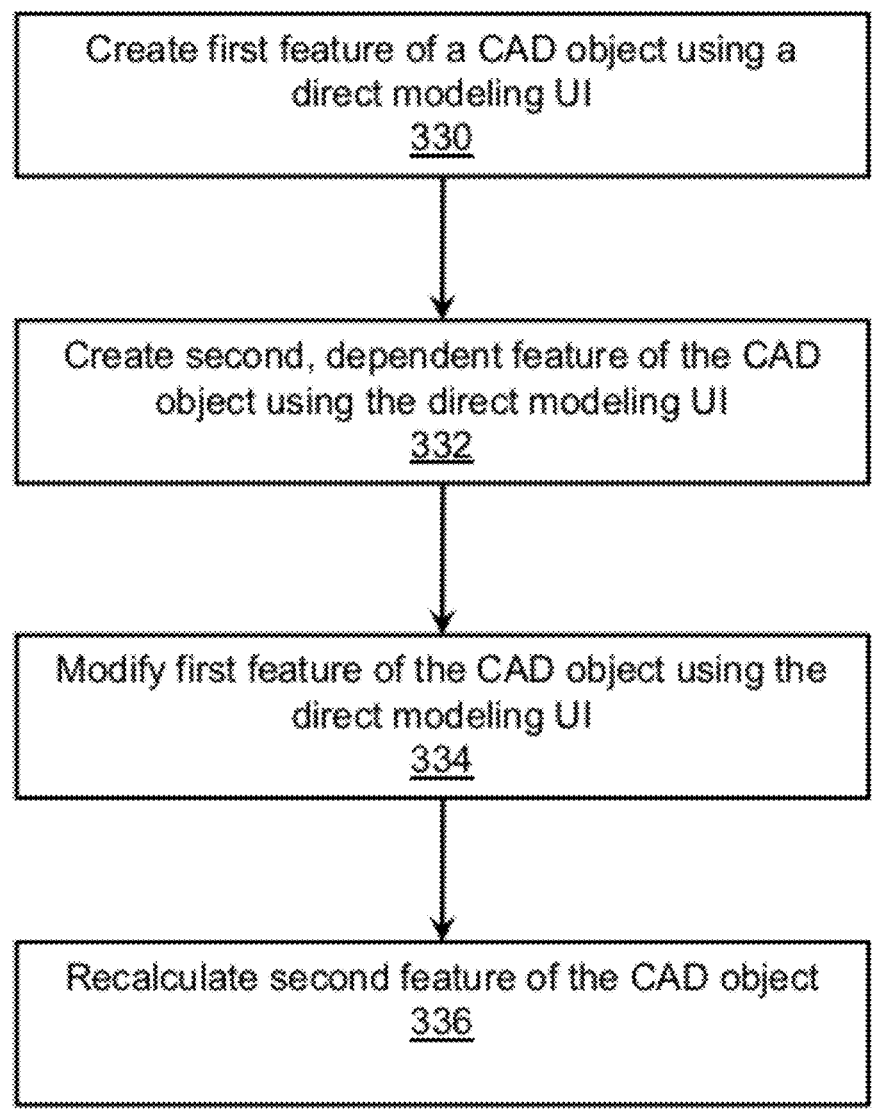
FIG. 3C is a flow chart of another embodiment of a method of computer-aided design.

Shown in FIG. 3C is a flow chart of another embodiment of a method of computer-aided design. In brief overview, at step 330, a user may create a first feature of a CAD object using a direct modeling UI of a CAD application executed by a processor of a computing device. At step 332, the user may create a second, dependent feature of the CAD object using the direct modeling UI. At step 334, the user may modify the first feature of the CAD object using the direct modeling UI. At step 336, the CAD application may recalculate geometry of the second feature of the CAD application.

Still referring to FIG. 3C and in more detail, at step 330, a user may create a first feature of a CAD object using a direct modeling user interface. As discussed above, in many embodiments, the user may be unaware that they are creating a feature. Instead, an underlying parametric geometry engine may interpret the user's commands and direct manipulations of geometry in the direct modeling UI as creation and modification of parametric features.

At step 332, in some embodiments, the user may create a second feature of a CAD object with a dependency on the first feature using the direct modeling user interface. In many embodiments, as discussed above, the user may be unaware both that they are creating a feature and that they are creating a feature with a dependent relationship on the first feature.

At step 334, in some embodiments, the user may modify the first feature of the CAD object using the direct modeling user interface. As discussed above, in many embodiments, the user may be unaware that they are modifying a feature. In other embodiments, the user may modify a surface, edge, vertex or other entity of the CAD object using the direct modeling user interface, without apparently modifying an existing first feature or the user being aware that a feature is associated with the entity. Thus, in some embodiments, at step 334, the user may modify geometry of the first feature using direct modeling user interface.

At step 336, in some embodiments, the CAD application may recalculate or regenerate geometry of the second feature. This may be done responsive to the user's modification of the first feature. In a further embodiment, the CAD application may direct a display engine to render or display the regenerated geometry data.

Figure 3D:
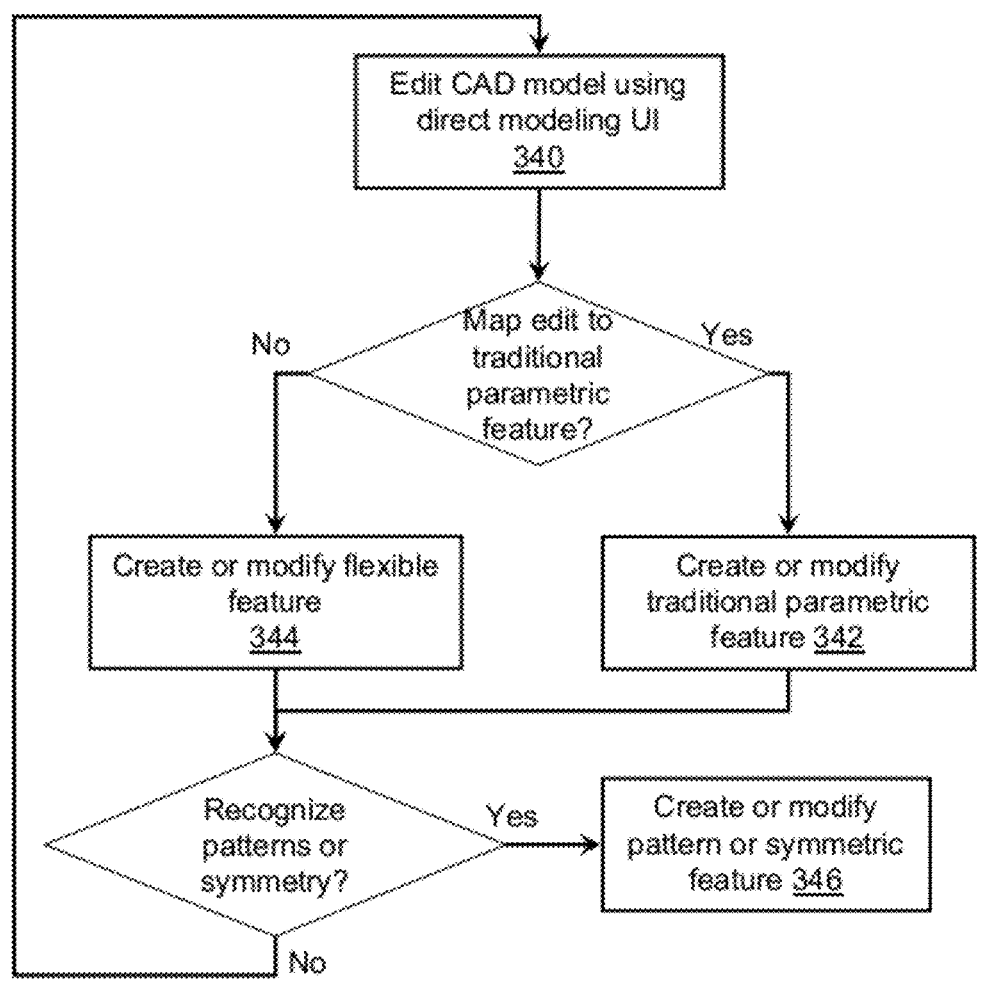
FIG. 3D is a flow chart of yet another embodiment of a method of computer-aided design.

Referring briefly to FIG. 3D, shown is a flow chart of yet another embodiment of a method of computer-aided design. As discussed above, this embodiment describes mapping, by the geometry engine, direct modeling edits to traditional and flexible parametric features. In brief overview, at step 340, a user of a direct modeling user interface of a CAD application makes an edit or modification to a CAD model. A parametric geometry engine of the CAD application determines if it can map the edit or modification to a traditional parametric feature. If so, at step 342, the parametric geometry engine creates or modifies a parametric feature in a history-based parametric feature recipe. If not, at step 344, the parametric geometry engine creates or modifies a flexible parametric features, such as a flex move or flex move copy feature, as discussed above. The parametric geometry engine then determines if it can recognize a pattern or symmetry associated with the feature. In one embodiment, this may comprise identifying an explicit pattern or symmetry creation command in the direct modeling user interface by the user. In another embodiment, this may comprise identifying an implicit pattern or symmetry creation, such as a copy and paste operation by the user in the direct modeling user interface. If the parametric geometry engine can recognize a pattern or symmetry, then at step 346, the parametric geometry engine may create or modify a flexible pattern or flexible symmetry feature of the parametric model. In some embodiments, steps 340-346 may be repeated.

In a further embodiment, the parametric geometry engine may recalculate or regenerate one or more features according to the parametric features list, responsive to the user's edit to geometry. In yet another further embodiment, modification by the user in the direct modeling user interface of an entity or feature associated with a flexible pattern or flexible symmetry feature may cause the parametric geometry engine to propagate the edit to corresponding entities or features of the pattern or symmetry feature. In some embodiments, only the most recent feature the user has created in the direct modeling user interface may be recalcualted or regenerated. Because direct modeling CAD typically does not regenerate features not modified by a user because of the lack of parametric dependencies, history, and relationships, it may be confusing to a user if multiple features are regenerated in response to a single operation. In other embodiments, additional features may be recalculated or regenerated, depending on type or class of feature. For example, certain types of features may be easier to regenerate, or the user may be confused if certain types of features are not regenerated. Accordingly, in one such embodiment, these features may be regenerated, even if others are not.

As discussed above, in CAD systems that import and translate a direct model into a parametric modeling environment, there is typically a loss of data fidelity and product information. Similarly, when importing a parametric model into a direct modeling environment, there is typically a loss of parametric features, including history, design intent, and dependencies and relationships among objects and entities. Furthermore, engineering and geometric constraints are typically lost. For example, a first surface may be constrained in a parametric environment to be parallel to a second surface, such that rotating one causes a geometry engine to recalculate and rotate the other accordingly. In another example, a model may include engineering constraints for material selection or safety reasons, such as requiring a specified thickness of material around a hole to be drilled, requiring a roll bar of a passenger compartment to be at least a certain diameter, or requiring an engine part to be a minimum distance from an operator position. If these constraints are lost during translation to a direct modeling environment, a user could easily move parts in ways that violate safety rules, resulting in higher manufacturing expense to redesign later. Additionally, if the model is then returned to the parametric modeling environment, because the constraints were lost during the first translation, they may not reappear. As a result, a user of the parametric modeling environment may believe that, because the parametric features of the imported model do not show engineering constraints that other parametric models may include, no such constraints exist.

By staying with a parametric modeling paradigm throughout both parametric modeling and direct modeling, in one embodiment of the present invention, constraints of features may be retained during direct modeling. A geometry engine may compare an attempted edit to a feature in a direct modeling user interface to an existing constraint, and, in one embodiment, prevent the user from completing the edit. In other embodiments, the geometry engine may present a dialog box to the user and allow them to reject the edit, override or delete the constraint, modify the constraint, or take other actions as appropriate. In still other embodiments, the geometry engine may allow one user to edit the feature, but not another user. This allows for ownership or user-based permissions of surfaces and features in a direct modeling user interface. For example, in one such embodiment, a lead designer may create a base set of features that only the lead designer can edit, such as a structural frame or powertrain, and secondary designers may then add, delete and modify additional optional features, such as seats, windows, electrical subsystems, or other elements. In some embodiments, a feature controlled in these methods may be referred to as a read-only surface or feature, or a constraint-locked feature.

Figure 3E:
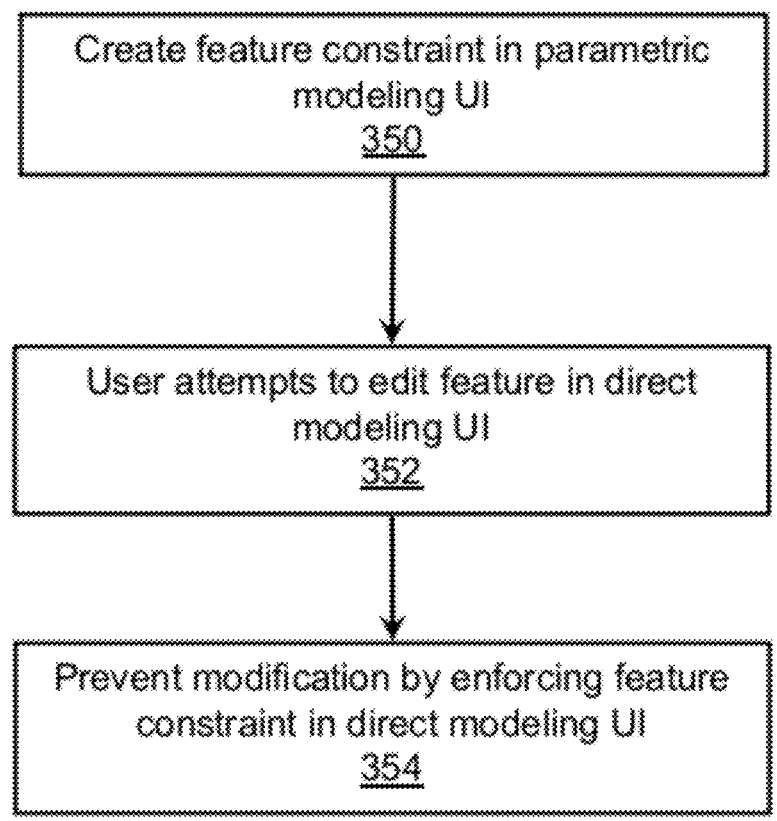
FIG. 3E is a flow chart of an embodiment of constraint locking in a method of computer-aided design.

Referring now to FIG. 3E, shown is a flow chart of an embodiment of a method of constraint locking in computer-aided design. In brief overview, at step 350, a user may create a feature constraint in a parametric modeling user interface of a CAD application. In one embodiment, the feature constraint may comprise a geometric constraint, such as a specified orientation with respect to or distance from another feature or other similar constraint. In another embodiment, the feature may comprise an engineering constraint, such as a material type, strength requirement, maximum weight allowance, or other similar constraint.

At step 352, in some embodiments, the user may attempt to edit the feature in a direct modeling user interface of the CAD application. As discussed above, attempting to edit the feature may comprise performing a direct manipulation on the feature, such as a push, pull, move, rotate, or other manipulation, or may comprise editing product information of the feature, such as a material, paint, surface, or other manufacturing aspect of the feature.

At step 354, in some embodiments, the parametric geometry engine may enforce the feature constraint in the direct modeling user interface, responsive to the user's attempt to edit the feature. As discussed above, enforcing the feature constraint may comprise rejecting or preventing the edit, presenting a dialog to the user, allowing the user to override or modify the constraint, enforcing permission-based editing by user or group ownership, or other enforcement mechanisms.

C. Systems and Methods for Creating Business Driven Assemblies

In some uses of CAD systems, a completed design may be used for manufacturing of many copies of the designed product. For example, a consumer automobile company may create a design for a new model of car, and then use an assembly line to create in excess of a hundred cars per day. However, in other users, a design may be used only once or twice. For example, the large towing engines for commercial semi-trailers, commonly referred to as tractors, prime movers, trucks, or big rigs, are frequently heavily customized prior to manufacture. One customer may request an extended cab, double-axle, five-speed manual transmission model, and another customer may request a regular cab, triple-axle, four speed automatic transmission model. Everything from tire tread depth to placement, size, and number of windows to the number of running lights may be specified, creating potentially thousands of different models. This typically results in a designer having to modify or create a new CAD model for each and every truck sold, raising prices and resulting in delays in delivering product.

Accordingly, one aspect of the present invention includes a method and system for creation of a dynamically-configurable product design, sometimes referred to as business driven assemblies. Such product designs may be referred to as driven by a bill-of-materials (BOM) or selection of options by a customer, sales representative, or vendor, and may be performed responsive to a product lifecycle management (PLM) plan. The system allows a customer to define specifications of a product, and then dynamically generates a CAD model responsive to the defined specifications or selected options.

Figure 4A:
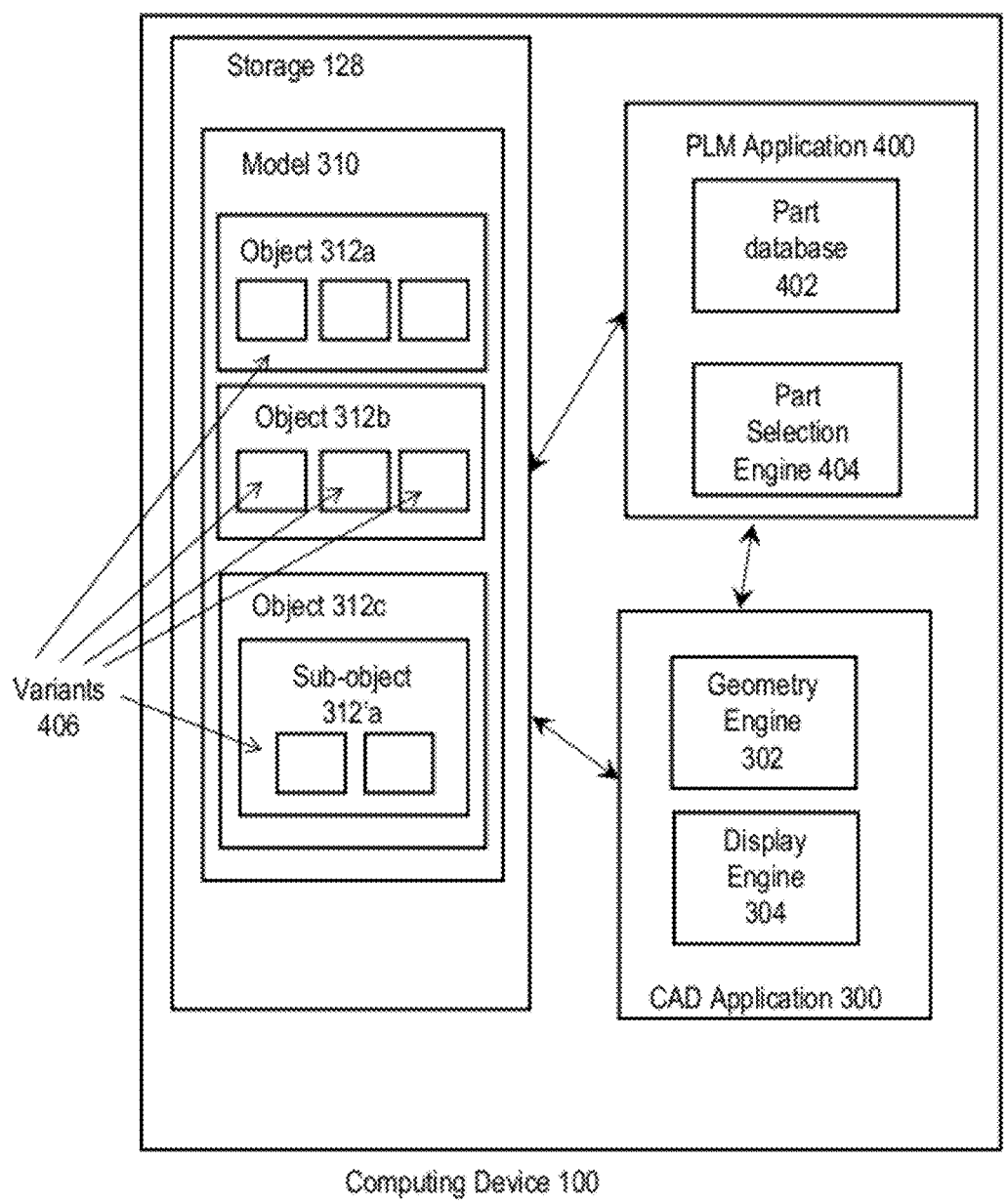
FIG. 4A is a block diagram of an embodiment of a system for creation of business driven assemblies.

Shown in FIG. 4A is a block diagram of an embodiment of a system for creation of business driven assemblies. In brief overview, and as discussed above, a computing device 100 executes a CAD application 300 and includes or communicates with storage 128, which includes one ore more models 310. Each object 312 and/or sub-object 312' may include one or more variants 406. In some embodiments, the computing device 100 may also execute or communicate with another computing device executing a product lifecycle management (PLM) application 400. PLM application 400 may, in some embodiments, comprise a part database 402 and/or a part selection engine 404.

Still referring to FIG. 4A and in more detail, in one embodiment, a computing device includes or executes a PLM application 400. Although shown on computing device 100, in many embodiments, PLM application 400 executes on a second computing device that communicates with or passes data to computing device 100. PLM application 400 may comprise an application, program, routine, web service, applet, or other executable instructions for configuring a product through selection of one or more predetermined options or variants. In many embodiments, PLM application 400 also comprises a user interface for presenting a part database 402 or portion thereof, and allowing a customer, sales representative, or other user to select one or more options for a product.

A part database 402 may comprise a database, file, library, or other set of one or more parts, and may include an identification of one or more features of a part. For example, the part database may include descriptions, costs, weights, materials and sub-parts needed, part numbers, or other information useful to a customer, sales representative, or manufacturer. Part database 402 may be used, along with a part selection engine 404 and/or a user interface to allow a customer to configure options for a product design and communicate said selected options to a parametric geometry engine 302 of a CAD application 300.

As discussed above, in some embodiments, objects 312 and/or sub-objects 312' may comprise one or more variant objects 406. In one embodiment, a variant 406 may comprise an alternate assembly to be used in a model or product design. In another embodiment, a variant 406 may include a default variant to be used in the absence of a selection by a user. In still another embodiment, a variant 406 may include a generic variant, sometimes referred to as a shape generic, which may be used as a placeholder in a model for later generation of a custom feature where a user wishes to apply a custom option that has not yet been created. For example, in one embodiment, a user may select from a predetermined list of options for truck tires including variations in size, width, and tread type and depth, or may select a generic tire shape, possibly just a torus, to be placed in the model until a tire is later selected.

In one embodiment, a variant 406 may comprise one or more interfaces or "handles" that trigger the parametric geometry engine to make modifications to geometry, shape or positioning of one or more adjacent objects. These handles or interfaces may sometimes be referred to as shapers or locators. In one embodiment, a locator handle or interface may comprise a constraint or joint-based interface used for positioning of an adjacent object. For example, a vehicle door object may include different options such as power doors or windows, which may require different routing of electrical cables. To accommodate these cables, different variants may have different centers of gravity or require different mounting options, and thus require different hinge positions. Accordingly, each variant may include one or more locator interfaces for a door hinge that correspond to one or more hinge elements on the vehicle frame. The geometry engine may automatically adjust positioning of the frame and/or door to match up the door hinges and the frame hinges.

Similarly, in one embodiment, a shaper handle or interface may cause the parametric geometry engine to adjust the geometry of an adjacent object. For example, different variants of engines may have exhaust ports or coolant intake ports in different positions. A shaper interface at an exhaust port, for instance, may correspond to a shaper interface on a front pipe of an exhaust system. Responsive to the relative positions of the shaper interface, the geometry engine may automatically extend, extrude, rotate, enlarge or shrink, or otherwise manipulate the front pipe of the exhaust system to match the position and orientation of the exhaust port. Similarly, shaper interfaces may be used in an electrical subsystem to cause the geometry engine to automatically extend and route cables to meet connectors of adjacent modules. Thus, selection of an option for a product design by a customer may cause the system to automatically place and reconfigure the design as necessary, reducing the need for human designers to manually edit each model.

Figure 4B:
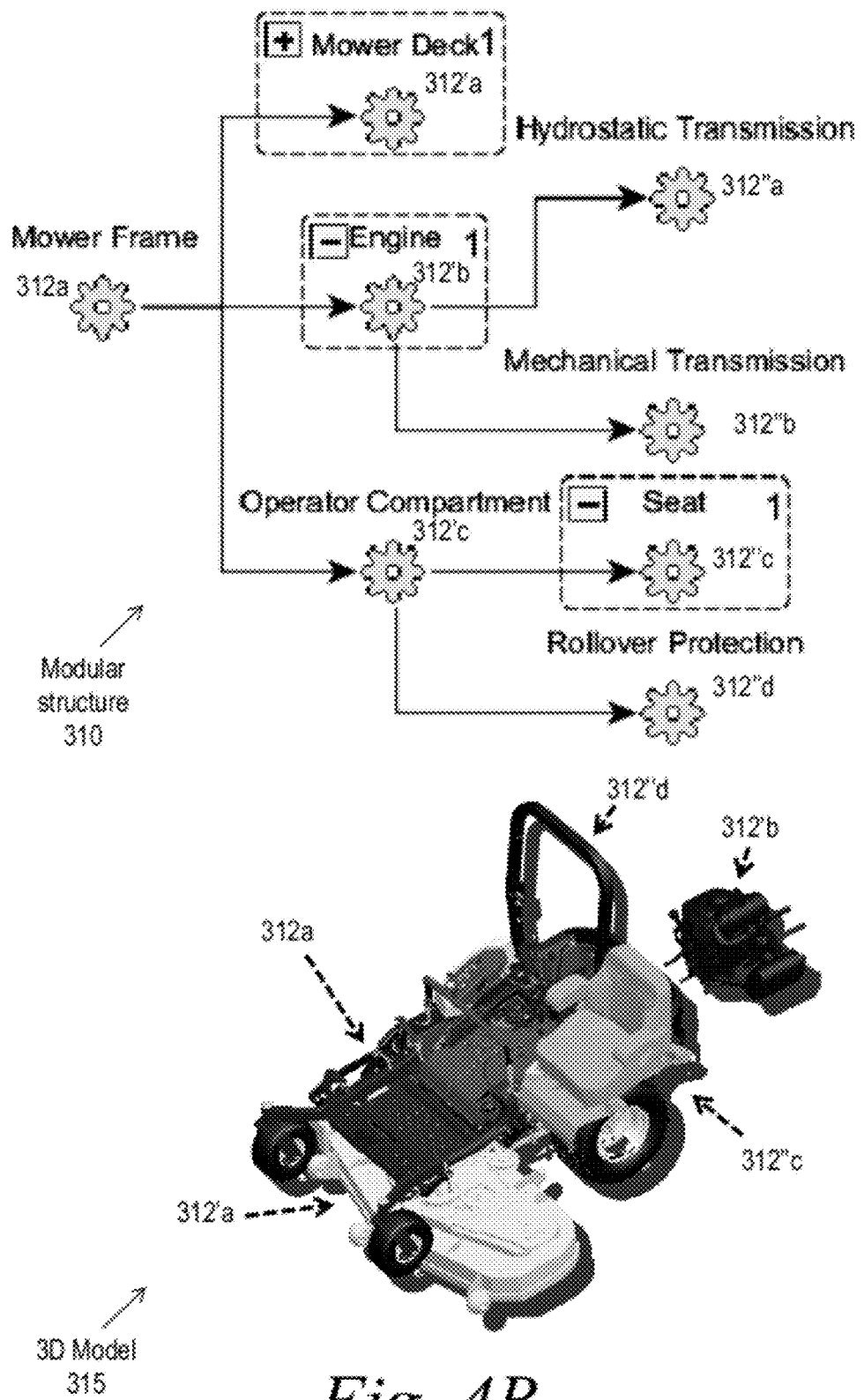
FIG. 4B is a tree diagram of a modular structure and three dimensional model of an example of a business driven assembly.

Referring now to FIG. 4B, shown is a tree diagram of a modular structure 310 and corresponding three dimensional model 315 of an example of a business driven assembly. In brief overview, the modular structure 310 may comprise a parametric feature-based recipe of objects 312, sub-objects 312', sub-sub-objects 312", or other levels of objects as discussed above. Associative links and dependencies of the model are shown in the structure 310 as branches in the tree diagram. In the example shown, a mower frame 312a is the base object for a mower, and has three children, the mower deck 312'a, engine 312'b, and operator compartment 312'c. The engine 312'b has two child objects, the hydrostatic transmission 312"a and mechanical transmission 312"b. Similarly, the operator compartment 312'c has two child objects, seat 312"c and rollover protection 312"d. Several of these component objects are visible in the three-dimensional model 315, which is included for clarity. As one skilled in the art may readily understand, in many embodiments, the feature-based recipe does not include an image of the 3D model, but rather the 3D model is generated by a display engine of a CAD application. In the modular structure, three components are outlined in dotted line, to signify that variants of these components exist for a user to select for product configuration. In some embodiments, an application may present the user with a tree diagram such as the one shown for selecting variant parts, while in other embodiments, configuration options may be presented in alternate manners, such as a configuration page of a web site, or even a printed form with checkboxes. As such, while the tree diagram of FIG. 4B is provided primarily as an abstraction to show dependencies of objects, in many embodiments, the tree diagram may also comprise part of a user interface.

Figure 4C:
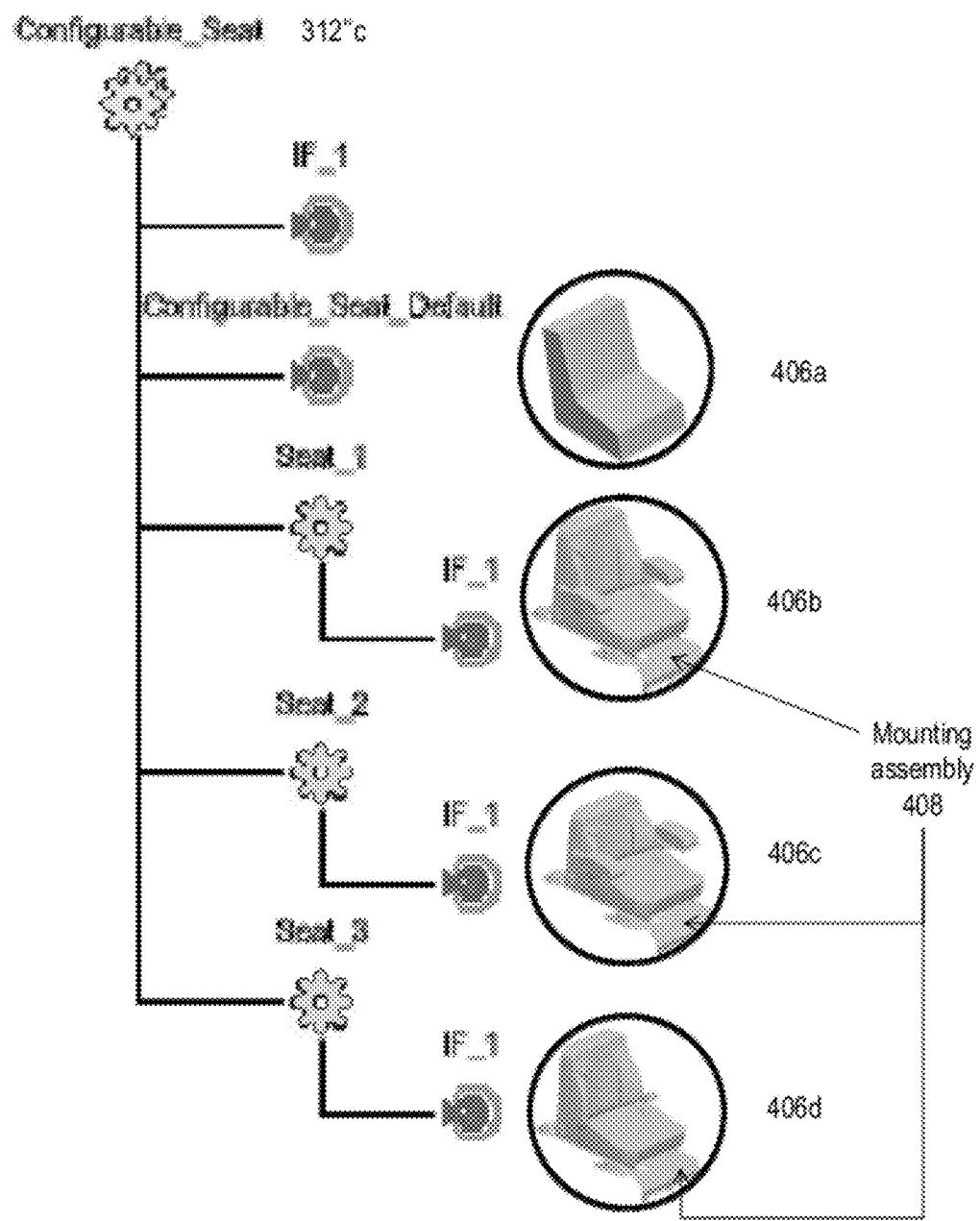
FIG. 4C is a tree diagram of an embodiment of a plurality of variants of a variable module in an example of a business driven assembly.

Referring now to FIG. 4C, shown is a tree diagram of an embodiment of a plurality of variants of a variable module in an example of a business driven assembly. In the example shown, one of the configurable modules presented in FIG. 4B, the seat 312"c, comprises four variants 406a-406d, referred to generally as variants 406. Each variant 406 comprises one or more geometric entities and features and may be predesigned or configured by a user of the system. As shown in variant 406a, in some embodiments, a variant may comprise a shape generic that may be used as a placeholder in the model, representative of the object. As discussed above, each variant may include one or more locator and/or shaper interfaces. For example, in the example shown, each seat 406b-406d includes a similar mounting assembly 408. Referring back briefly to FIG. 4B, mounting assembly 408 can be seen where it connects to a portion of operator compartment 312'c and/or frame 312a. Accordingly, in some embodiments, each seat 406a-d may include a locator interface to allow the parametric geometry engine to automatically orient the seat properly in the model against a corresponding interface on the operator compartment 312'c and/or frame 312a. In another embodiment, each seat 406a-d may include a shaper interface to reposition mounting hardware of operator compartment 312'c and/or frame 312a as necessary. Similarly, locator and shaper interfaces may be used to adjust position of the rollover protection 312"d, as well as steering and control elements, shock absorbers, or any other feature of the model.

Figure 4D:
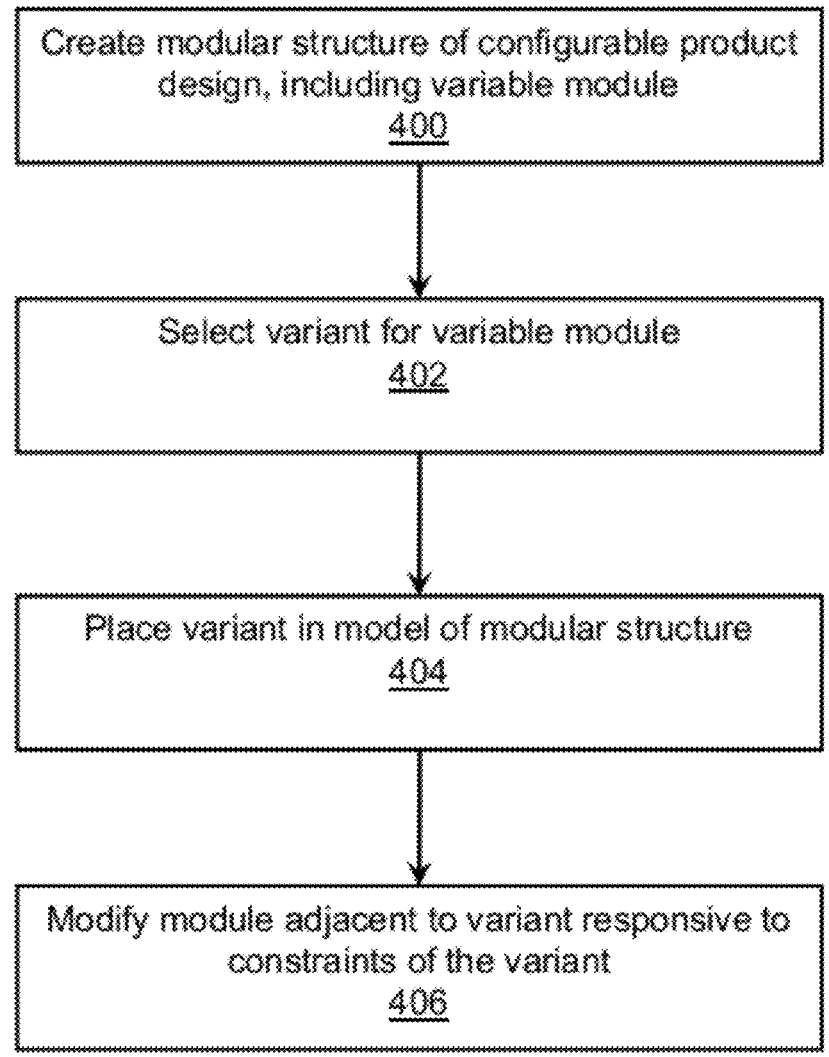
FIG. 4D is a flow chart of an embodiment of a method of creation of business driven assemblies.

Referring now to FIG. 4D, shown is a flow chart of an embodiment of a method of creation of business driven assemblies. In brief overview, in one embodiment, at step 420, a user or designer may create a modular structure of a plurality of modules of a dynamically configurable product design using a CAD application. The plurality of modules may comprise at least one variable module comprising a plurality of variants or a default and at least one variant. At step 422, the user may select a variant of the at least one variable module to use in the dynamically configurable product design. At step 424, the CAD application or a geometry engine of the CAD application may place the selected variant in a geometric model of the dynamically configurable product design. At step 426, the CAD application may modify position or geometry of a module adjacent to the placed selected variant in the geometric model, responsive to one or more constraints of the placed selected variant.

Still referring to FIG. 4D and in more detail, at step 420, a user of a computer aided design application may create a modular structure of a plurality of modules of a dynamically configurable product design. In some embodiments, the plurality of modules may comprise at least one variable module. In many embodiments, the modular structure may comprise an historic feature-based parametric construction recipe, where dependencies between one or more objects and/or features may implicitly create the modular structure. For example, in a parametric history with a base object, and two dependent objects, the dependencies between the dependent objects and the base object may be considered a modular structure. In some embodiments, a module may refer to an individual object or a feature, but in most embodiments, a module may refer to a group of objects or features comprising a sub-assembly of a product, such as a functional module such as a keypad or an engine, or a structural module, such as a product face plate or vehicle frame. Although referred to as functional or structural modules, other classifications of modules may be used without limitation.

In some embodiments, the variable module may comprise a plurality of alternate sub-assemblies, with common connections to adjacent modules. In one embodiment, the variable module may include a default sub-assembly or variant. In another embodiment, the variable module may include a generic shape sub-assembly with only basic features. In one embodiment, a common connection to an adjacent module of the sub-assembly may comprise a locator interface or a shaper interface, as discussed above, which may be used by a parametric geometry engine to modify positioning of modules or geometry of modules.

At step 422, in one embodiment, a user may select a variant of the variable module to use in the dynamically configurable product design. As discussed above, in one embodiment, the user may use a selection interface of a PDM application, while in another embodiment, the user may use a web form, an order form, a catalog, or any other form for selecting a variant to use in the design.

At step 424, the CAD application or a geometry engine of the CAD application may place the selected variant in a geometric model of the dynamically configurable product design. In some embodiments, placing the selected variant in a geometric model may comprise executing, by the geometry engine, a feature list or recipe of the variant to construct the variant in the geometric model.

At step 426, in some embodiments, the CAD application or geometry engine may modify positioning or geometry of the variant or of a module adjacent to the placed selected variant in the geometric model responsive to one or more constraints of the placed selected variant. These one or more constraints may be identified by one or more locator or shaper interfaces, as discussed above. In one embodiment, the CAD application or geometry engine may translate and/or rotate the selected variant to align one or more locator interfaces of the selected variant with one or more locator interfaces of one or more adjacent modules or objects. In another similar embodiment, the CAD application or geometry engine may translate and/or rotate the one or more adjacent modules or objects to align one or more locator interfaces of the one or more adjacent modules or objects with one or more locator interfaces of the selected variant. In another embodiment, the CAD application or geometry engine may scale or stretch the selected variant to cause one or more shaper interfaces of the variant to align with one or more shaper interfaces of one or more adjacent modules or objects. In yet another embodiment, the CAD application or geometry engine may extend, twist, or otherwise route geometry of the variant to align one or more shaper interfaces of the variant with one or more shaper interfaces of an adjacent module or object. In a similar embodiment, the CAD application or geometry engine may extend, twist, or otherwise route geometry of an adjacent module or object to align one or more shaper interfaces of the adjacent module or object with one or more shaper interfaces of the variant.

D. Systems and Methods for Dynamically Loading Portions of a Computer-Aided Design Model on Demand In many CAD systems, the system may load all parts or features of a CAD model at once. For example, and as discussed above, in many CAD systems a geometry engine may execute, regenerate, or recalculate each step of a history-based feature list to construct a CAD model for display by a display or rendering engine. With a simple model with only a few features, this can be done quickly. However, complicated models may include thousands or tens of thousands of parts, each comprising dozens or hundreds of individual features. For example, a model of a truck may comprise separate parts for the frame, axels, universal joints, elements of the power train, elements of brake assemblies, electrical subsystems, lights, hydraulics, windows, seats, instruments, exhaust systems, fuel lines, etc. The engine alone may comprise several hundred parts and several thousand features.

To reduce memory requirements and regeneration times, many CAD designers break a CAD model into subsections and design each subsection in different models. For example, a CAD designer may have a single model that only includes the electrical systems, and a second model that only includes the non-moving parts of the frame, and a third model that only includes the engine fuel/exhaust system, etc. However, this may lead to confusion and inefficiencies, as well as errors where a modification is made to one subsection, such as engine mounts of a frame, that will require modifications in a different subsection, such as the engine itself Because these parts are not in the same model, the designer must perform complicated manual bookkeeping to ensure that the models are synchronized and compatible. Additionally, the ability to perform engineering and manufacturing analysis on the model is reduced, because features such as weight and center of gravity will be a result of a combination of all of the subsections.

Accordingly, one aspect of the present invention features systems and methods for dynamically loading portions of a computer-aided design model on demand. In one embodiment, a CAD application may progressively load portions of a CAD model as needed by a user for a particular design task. This reduces both memory and processing requirements, and creates the potential for a executing a CAD application with access to a complete CAD model on devices with limited resources, such as a laptop, a tablet computer, a smartphone, or any other system.

By way of example, in one embodiment, a user may retrieve a model of a vehicle in order to assemble one or more new components. The CAD application may load the vehicle structure and graphics for display. The user may then select new components to add, such as a transmission assembly. The CAD application may load the transmission structure and graphics for display. When the user selects specific geometry of the vehicle structure to use in defining constraints for the transmission, those selected geometry references may be loaded by the CAD application, without loading the entire geometry of the model.

Figure 5A:
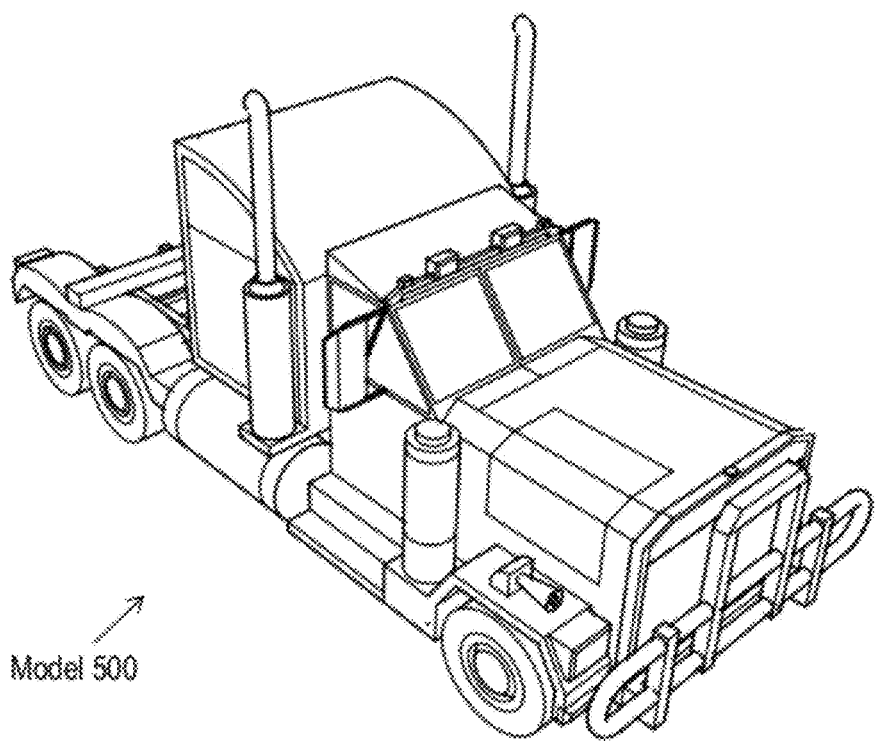
FIG. 5A is a three-dimensional view of an example of a computer-aided design model.

For example, shown in FIG. 5A is a three-dimensional view of an example of a computer-aided design model 500 of a truck. The CAD application may load graphics of the model 500, which in one embodiment, may be stored with the model or in a separate file. In another embodiment, graphics may be generated dynamically, but without loading geometry of the entire model. For example, in one embodiment, during prior creation of the model, the CAD application may determine a shell or set of outer, visible surfaces of the model, and store a geometric representation of these surfaces. This shell representation may be used to dynamically generate graphics, without needing to load geometry of underlying, hidden or internal surfaces. In some embodiments, the CAD application may also load a modular structure of the model, as discussed above in connection with FIGS. 4A-4D. Although shown in FIG. 4B as a collection of sub-assemblies, in many embodiments, a modular structure may comprise a structure of individual objects or features. For example, rather than referencing a seat, as in FIG. 4B, a modular structure may include a base portion of a seat, a back rest, internal framing, one or two armrests, cushions or other padding, various seams and stitching, etc., each with dependencies and relationships with other geometric entities and parts. In one embodiment, the CAD application may load a portion of a modular structure, such as the group of elements referred to as the seat in the above example. Similarly, in the example shown in FIG. 5A, the CAD application may load an overall modular structure of the truck, including the frame, cab, engine compartment, powertrain, etc., without loading individual elements of each sub-assembly.

Figure 5B:
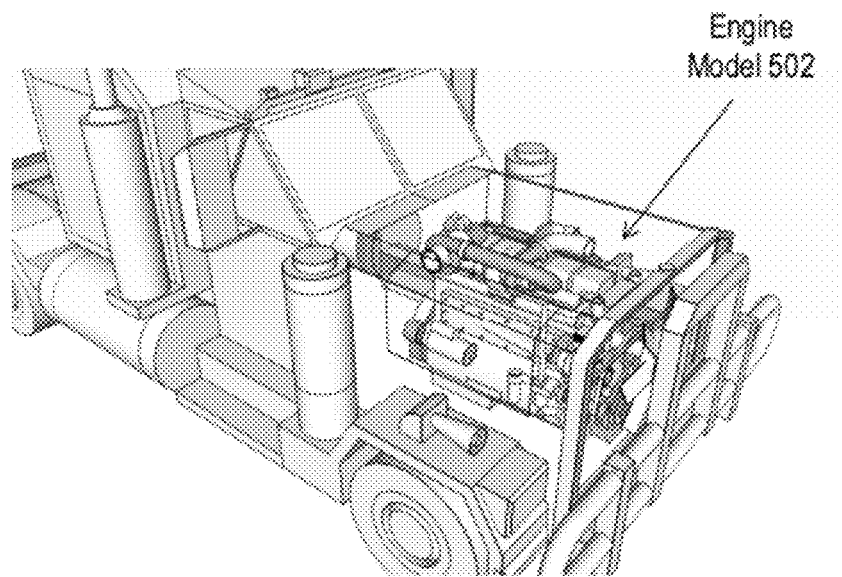
FIG. 5B is a three-dimensional view of a sub-assembly of the example of the computer-aided design model.

As shown in FIG. 5B in a three-dimensional view of a sub-assembly of the example of the computer-aided design model, in one embodiment and by way of example, the user may select a sub-assembly such as engine model 502. Responsive to the selection, the CAD application may load a modular structure of the engine model and graphics and geometry data of the engine. In some embodiments, the graphics data may comprise graphics data of only external or visible elements of the engine, and may be stored or generated as discussed above.

Figure 5C:
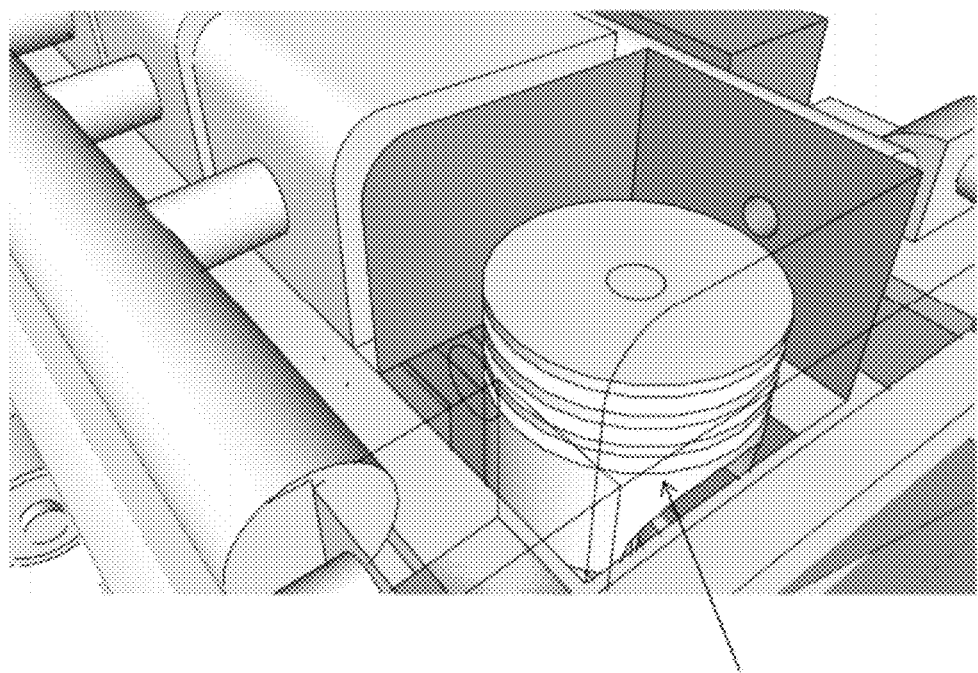
FIG. 5C is a three-dimensional view of a sub-assembly of the sub-assembly of the example of the computer-aided design model.

Continuing with this process of "drilling down" into the model through progressive loading, shown in FIG. 5C is a three-dimensional view of a sub-assembly of the sub-assembly of the example of the computer-aided design model. As shown, in one embodiment and by way of example, the user may select a sub-assembly of the engine such as engine piston model 504. Responsive to the selection, the CAD application may load a modular structure of the engine piston model and graphics and geometry data of the engine piston. In some embodiments, the graphics data may comprise graphics data of only external or visible elements of the engine piston, and may be stored or generated as discussed above.

In some embodiments, when the user modifies geometry of a selected object that includes a constraint or reference to a second object, geometry and graphics data of the second object may be loaded. For example, if the user attempts to modify the diameter of the engine piston, and the diameter has a constraint or relationship to a surrounding cylinder, the CAD application may load geometry of the cylinder to enforce constraints and recalculate or regenerate features as necessary. Accordingly, the user has full ability to manipulate and edit all features of even a highly complex model with reduced memory and processing requirements.

Figure 5D:
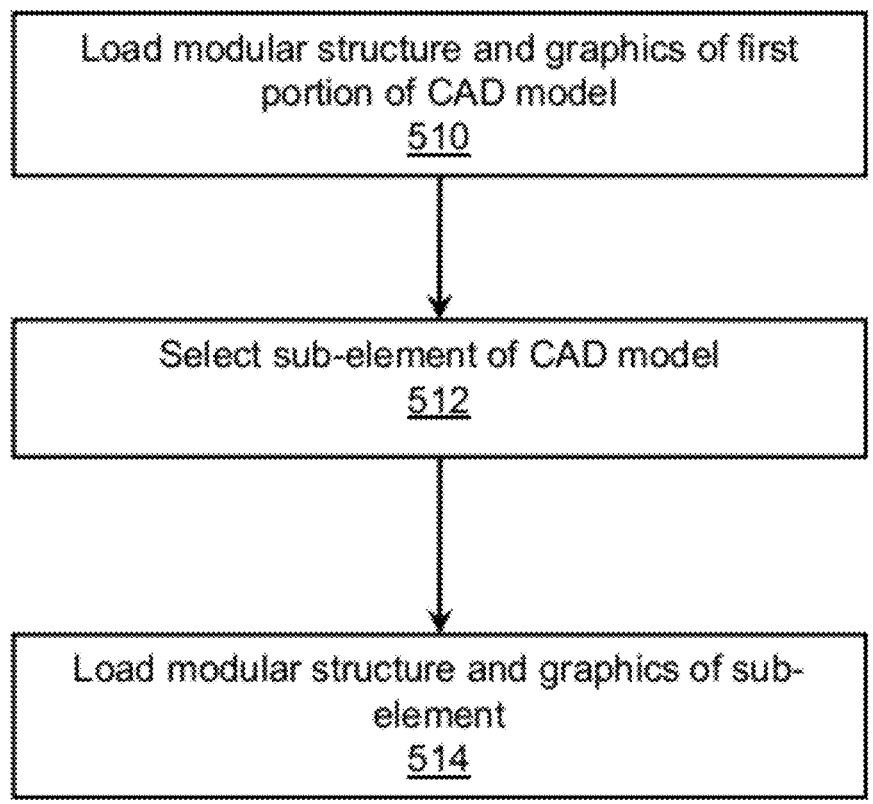
FIG. 5D is a flow chart of an embodiment of a method for dynamically loading portions of a computer-aided design model on demand.

Shown in FIG. 5D is a flow chart of an embodiment of a method for dynamically loading portions of a computer-aided design model on demand. In brief overview, at step 510, a CAD application may load a first portion of a CAD model. In one embodiment, the first portion of the CAD model may comprise a modular structure of the CAD model. In a further embodiment, the modular structure may comprise one or more sub-assemblies or modules of the CAD model. In another embodiment, the first portion of the CAD model may comprise graphics and geometry data of a first element of the modular structure. In a further embodiment, the first element of the modular structure may comprise a root element, assembly, or module of the modular structure. In another further embodiment, the graphics data may comprise a shell or outer surface or surfaces of the modular structure or CAD model.

At step 512, in some embodiments, the user may select a second element of the modular structure. In some embodiments, the second element may comprise a sub-element of the modular structure. In other embodiments, such as where the user has finished working on a component in the engine compartment of the truck shown in FIGS. 5A-5C and now wishes to work on a component in the rear brakes, the second element may comprise a non-directly related element or sub-assembly in the modular structure. In a further embodiment, selection by the user of a non-directly related element may cause the CAD application to unload graphics and geometry data of the first element from memory.

At step 514, in some embodiments, responsive to the selection by the user of the second element, the CAD application may load a second portion of the CAD model the second portion comprising a modular structure of the selected second element. In a further embodiment, the modular structure of the second element may comprise one or more sub-assemblies or modules of the second element. In another embodiment, the second portion of the CAD model may comprise graphics and geometry data of the selected second element. In a further embodiment, the graphics data may comprise a shell or outer surface or surfaces of the selected second element.

In some embodiments, steps 512-514 or 510-514 may be repeated. In one embodiment, a user may select one or more items of geometry data of a third element of the modular structure for defining a constraint of geometry data of the first element or the second element; and the CAD application may load, responsive to the selection, the selected one or more items of geometry data of the third element. In some embodiments, loading graphics and geometry of the third element may comprise not loading unselected items of geometry data of the third element. For example, in the piston and cylinder example discussed above, the CAD application may load a diameter of the cylinder when the user attempts to edit a diameter of the piston, but not load a depth or other features of the cylinder if they are not needed. Furthermore, as discussed above, in many embodiments, selecting a non-directly related element of the model may cause the CAD application to unload earlier loaded portions of the model, to free up memory.

In some embodiments, loading graphics and geometry of an element may comprise loading one or more location interfaces or shaper interfaces of the element. In one embodiment, loading graphics and geometry data of an element may comprise identifying one or more visible or external surfaces of the element, and loading graphics and geometry data of the identified visible or external surfaces of the element. In one embodiment, such as where the user is adding an element to a model, selecting the element may comprise adding the element to the modular structure of a previous element.

CONCLUSION

It should be understood that the systems described above may provide multiple ones of any or each of those components and these components may be provided on either a standalone machine or, in some embodiments, on multiple machines in a distributed system. The systems and methods described above may be implemented as a method, apparatus or article of manufacture using programming and/or engineering techniques to produce software, firmware, hardware, or any combination thereof. In addition, the systems and methods described above may be provided as one or more computer-readable programs embodied on or in one or more articles of manufacture. The term "article of manufacture" as used herein is intended to encompass code or logic accessible from and embedded in one or more computer-readable devices, firmware, programmable logic, memory devices (e.g., EEPROMs, ROMs, PROMs, RAMs, SRAMs, etc.), hardware (e.g., integrated circuit chip, Field Programmable Gate Array (FPGA), Application Specific Integrated Circuit (ASIC), etc.), electronic devices, a computer readable nonvolatile storage unit (e.g., CD-ROM, floppy disk, hard disk drive, etc.). The article of manufacture may be accessible from a file server providing access to the computer-readable programs via a network transmission line, wireless transmission media, signals propagating through space, radio waves, infrared signals, etc. The article of manufacture may be a flash memory card or a magnetic tape. The article of manufacture includes hardware logic as well as software or programmable code embedded in a computer readable medium that is executed by a processor. In general, the computer-readable programs may be implemented in any programming language, such as LISP, PERL, C, C++, C#, PROLOG, or in any byte code language such as JAVA. The software programs may be stored on or in one or more articles of manufacture as object code.

Having described certain embodiments of methods and systems for providing seamless thumbnails for hosted applications, it will now become apparent to one of skill in the art that other embodiments incorporating the concepts of the invention may be used.

What is claimed is:

1. A method for creating a dynamically-configurable product design, the method comprising:
    creating, via a computer-aided design (CAD) application executing on a processor of a computing device, a modular structure comprising a plurality of geometric modules of a dynamically-configurable product design, the plurality of geometric modules comprising at least one variable geometric module;
    providing a plurality of predetermined variants of the at least one variable geometric module for selection by a user, the predetermined variants each having a parametric geometry;
    receiving an input from the user identifying a selected variant chosen by the user from the plurality of predetermined variants of the at least one variable geometric module, the selected variant comprising at least one of a locator handle and a shaper handle;
    automatically placing, by the processor, the selected variant in a geometric model of the dynamically-configurable product design; and
    triggering a parametric geometry engine by the at least one of the locator handle and the shaper handle;
    responsive to the triggering of the parametric geometry engine, automatically modifying, by the parametric geometry engine, at least one of a positioning or a geometry of a geometric module adjacent to the placed selected variant in the geometric model of the dynamically-configurable product design in accordance with the at least one of the location handle and the shaper handle, thereby integrating the placed selected variant with the adjacent geometric module.

2. The method of claim 1, wherein the modular structure comprises a tree of relationships of modules of a product design.

3. The method of claim 1, wherein each module of the product design includes a locator interface or a shaper interface.

4. The method of claim 1, wherein the plurality of variants of the at least one variable module includes a generic variant.

5. The method of claim 1, wherein the plurality of predetermined variants are presented by a product configuration tool.

6. The method of claim 1, wherein placing the selected variant in the geometric model comprises replacing a previously-used variant of the at least one variable module in the geometric model with the selected variant.

7. The method of claim 1, wherein modifying positioning or geometry of a module adjacent to the placed selected variant comprises modifying positioning or geometry of the adjacent module to align an interface of the adjacent module to a corresponding interface of the placed selected variant.

8. The method of claim 1, wherein the one or more constraints of the placed selected variant comprise rules for aligning a locator or shaper interface of an adjacent module to a corresponding locator or shaper interface of the placed selected variant.

9. The method of claim 1, wherein the dynamically-configurable product design comprises a historic instruction list of feature-based geometry of a CAD model.

10. The method of claim 1, further comprising automatically modifying by the parametric geometry engine a geometry of the placed selected variant itself.

11. The method of claim 10, wherein the automatic modifying of the geometry of the placed selected variant by the parametric geometry engine is performed by executing instructions triggered by the shaper handle.

12. A system for creation of a dynamically-configurable product design, comprising:
    a computing device comprising a processor, the processor configured to execute:
    a computer-aided design (CAD) application for creating, by a user of the CAD application, a modular structure comprising a plurality of geometric modules of a dynamically-configurable product design, the plurality of geometric modules comprising at least one variable module;
    a selection interface for selecting, by the user from a plurality of predetermined variants of the at least one variable geometric module, a variant to use in the dynamically-configurable product design, the predetermined variants each having a parametric geometry; and
    a parametric geometry engine for placing the selected variant in a geometric model of the dynamically-configurable product design, and modifying a positioning or geometry of a geometric module adjacent to the placed selected variant in the geometric model responsive to one or more constraints of the placed selected variant, the selected variant comprising at least one of a locator handle and a shaper handle, the at least one of a locator handle and a shaper handle configured to trigger the parametric geometry engine to modify the position or geometry, respectively, of the geometric module adjacent to the placed selected variant in accordance with the at least one of the location handle and the shaper handle, thereby integrating the placed selected variant with the adjacent geometric module.

13. The system of claim 12, wherein the modular structure comprises a tree of relationships of modules of a product design.

14. The system of claim 12, wherein each module of the product design includes a locator interface or a shaper interface.

15. The system of claim 12, wherein each variant of the plurality of variants of the at least one variable module includes a corresponding locator interface or shaper interface.

16. The system of claim 12, wherein the plurality of variants of the at least one variable module includes a generic variant.

17. The system of claim 12, wherein selecting a variant comprises selecting, by the user, a variant from a predetermined list of variants of the variable module presented by a product configuration tool.

18. The system of claim 12, wherein placing the selected variant in the geometric model comprises replacing a previously-used variant of the at least one variable module in the geometric model with the selected variant.

19. The system of claim 12, wherein modifying positioning or geometry of a module adjacent to the placed selected variant comprises modifying positioning or geometry of the adjacent module to align an interface of the adjacent module to a corresponding interface of the placed selected variant.

20. The system of claim 12, wherein the one or more constraints of the placed selected variant comprise rules for aligning a locator or shaper interface of an adjacent module to a corresponding locator or shaper interface of the placed selected variant.

21. The system of claim 12, wherein the dynamically-configurable product design comprises a historic instruction list of feature-based geometry of a CAD model.

\* \* \* \* \*